United States Patent
Jung et al.

(10) Patent No.: US 11,152,047 B2
(45) Date of Patent: Oct. 19, 2021

(54) MAGNETORESISTIVE RANDOM ACCESS MEMORY CONTAINING MULTILAYER SYNTHETIC ANTIFERROMAGNETIC STRUCTURE AND METHOD OF MAKING THEREOF

(71) Applicant: WESTERN DIGITAL TECHNOLOGIES, INC., San Jose, CA (US)

(72) Inventors: Wonjoon Jung, San Jose, CA (US); Michael Nicolas Albert Tran, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/661,210

(22) Filed: Oct. 23, 2019

(65) Prior Publication Data

US 2021/0125650 A1 Apr. 29, 2021

(51) Int. Cl.
| | | |
|---|---|---|
| *G11C 11/16* | (2006.01) | |
| *H01L 43/08* | (2006.01) | |
| *H01L 27/22* | (2006.01) | |
| *H01L 43/10* | (2006.01) | |
| *H01L 43/12* | (2006.01) | |

(52) U.S. Cl.
CPC .......... *G11C 11/161* (2013.01); *H01L 27/222* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 2002/0186513 A1 | 12/2002 | Heinonen et al. | |
| 2006/0262594 A1 | 11/2006 | Fukumoto | |
| 2009/0213503 A1 | 8/2009 | Sun et al. | |
| 2009/0219754 A1 | 9/2009 | Fukumoto | |
| 2012/0012952 A1* | 1/2012 | Chen | H01L 43/08 257/421 |
| 2014/0106183 A1 | 4/2014 | Sapozhnikov et al. | |
| 2014/0306302 A1 | 10/2014 | Jan et al. | |
| 2015/0332713 A1 | 11/2015 | Du et al. | |
| 2016/0181508 A1* | 6/2016 | Lee | H01L 43/08 257/421 |

(Continued)

OTHER PUBLICATIONS

"Tunable room-temperature magnetic skyrmions in Ir/Fe/Co/Pt multilayers" Anjan Soumyanarayanan et al., Nature Materials, vol. 16, pp. 1-10 (2017).

(Continued)

*Primary Examiner* — Michelle Mandala
*Assistant Examiner* — Jordan M Klein
(74) *Attorney, Agent, or Firm* — The Marbury Law Group PLLC

(57) ABSTRACT

A magnetic memory device contains a synthetic antiferromagnetic (SAF) structure that includes an antiferromagnetically coupled stack and a reference layer. The antiferromagnetically coupled stack contains plural multilayer stacks. Each multilayer stack contains at least one ferromagnetic material layer, a non-magnetic layer and a non-magnetic SAF spacer layer having a different composition than the non-magnetic layer.

17 Claims, 17 Drawing Sheets

(56) References Cited

U.S. PATENT DOCUMENTS

| | | |
|---|---|---|
| 2017/0092846 A1 | 3/2017 | Doyle et al. |
| 2018/0240970 A1* | 8/2018 | Oguz .................... H01L 43/08 |
| 2018/0248114 A1* | 8/2018 | Oguz ................ H01F 10/3286 |
| 2018/0248115 A1* | 8/2018 | Oguz .................... H01L 43/08 |
| 2019/0109281 A1 | 4/2019 | Doyle et al. |
| 2019/0304653 A1* | 10/2019 | Oguz ................ H01F 10/3254 |

OTHER PUBLICATIONS

U.S. Appl. No. 16/212,257, filed Dec. 6, 2018, SanDisk Technologies LLC.
U.S. Appl. No. 16/212,342, filed Dec. 6, 2019, SanDisk Technologies LLC.
U.S. Appl. No. 16/212,132, filed Dec. 6, 2018, SanDisk Technologies LLC.
U.S. Appl. No. 16/558,552, filed Sep. 3, 2019, Western Digital Technologies, Inc.
D. Watanabe et al., "Interlayer exchange coupling in perpendicularly magnetized synthetic ferrimagnet structure using CoCrPt and CoFeB", Journal of Physics: Conference Series 200 (2010) 072104, 5 pages.
Durga Khadka, et al., "Dzyaloshinskii—Moriya interaction in Pt/Co/Ir and Pt/Co/Ru multilayer films", Journal of Applied Physics 123, 123905 (2018) 6 pages.
R.B.Morgunov et al., "Effect of Co layer thickness on magnetic relaxation in Pt/Co/Ir/Co/Pt/GaAs spin valve", Journal of Magnetism and Magnetic Materials, vol. 459, Aug. 1, 2018, pp. 33-36.

\* cited by examiner

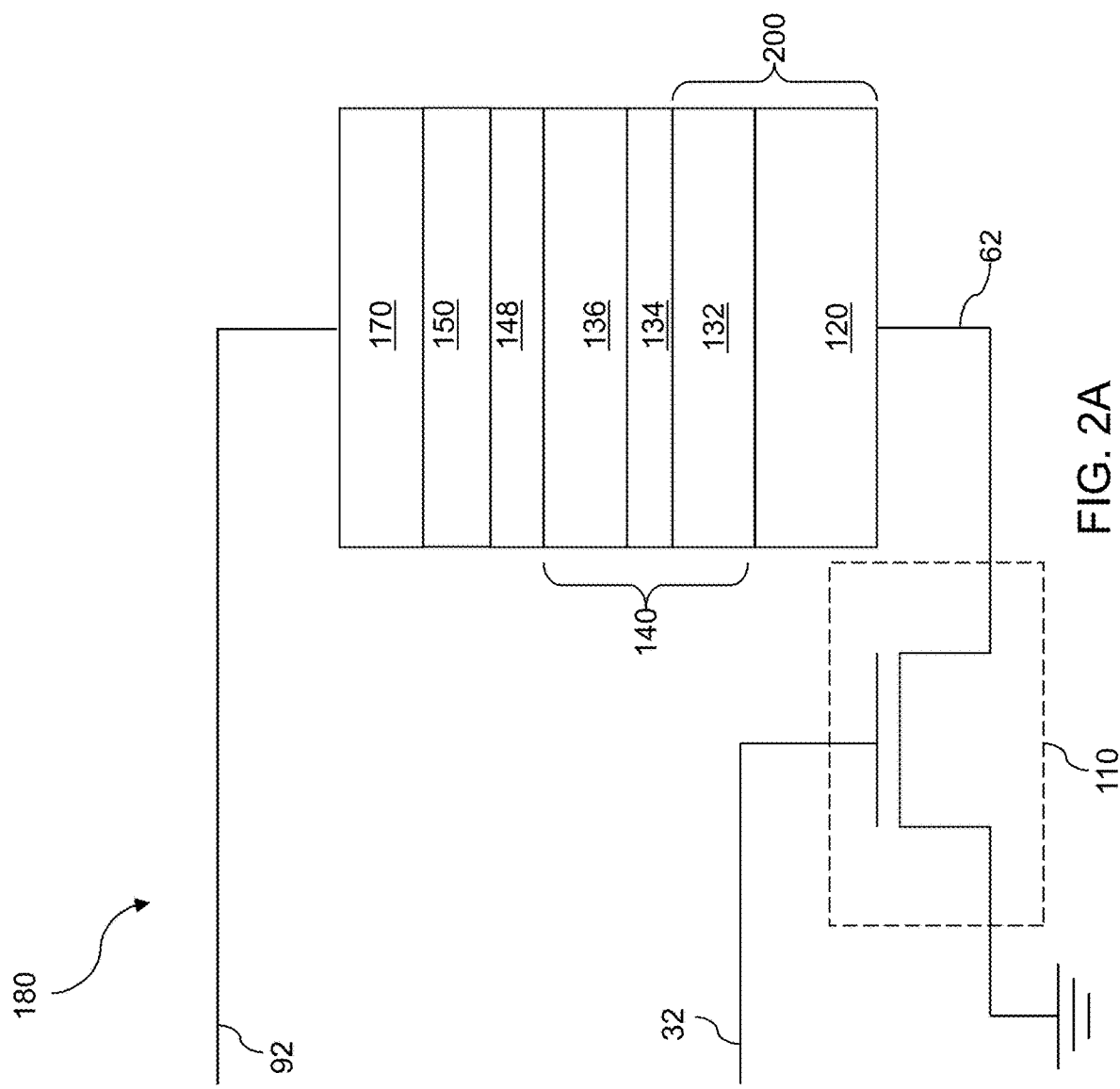

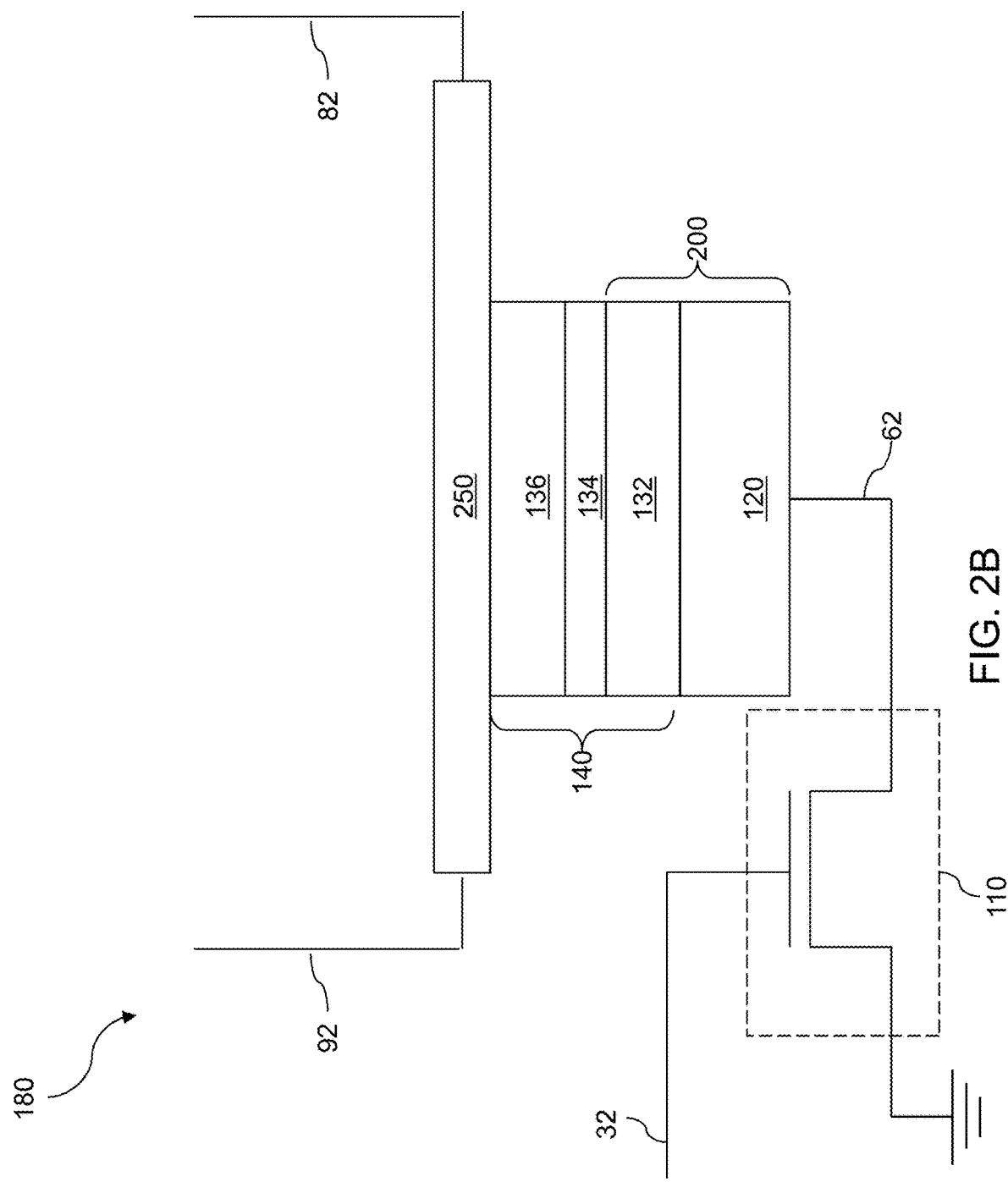

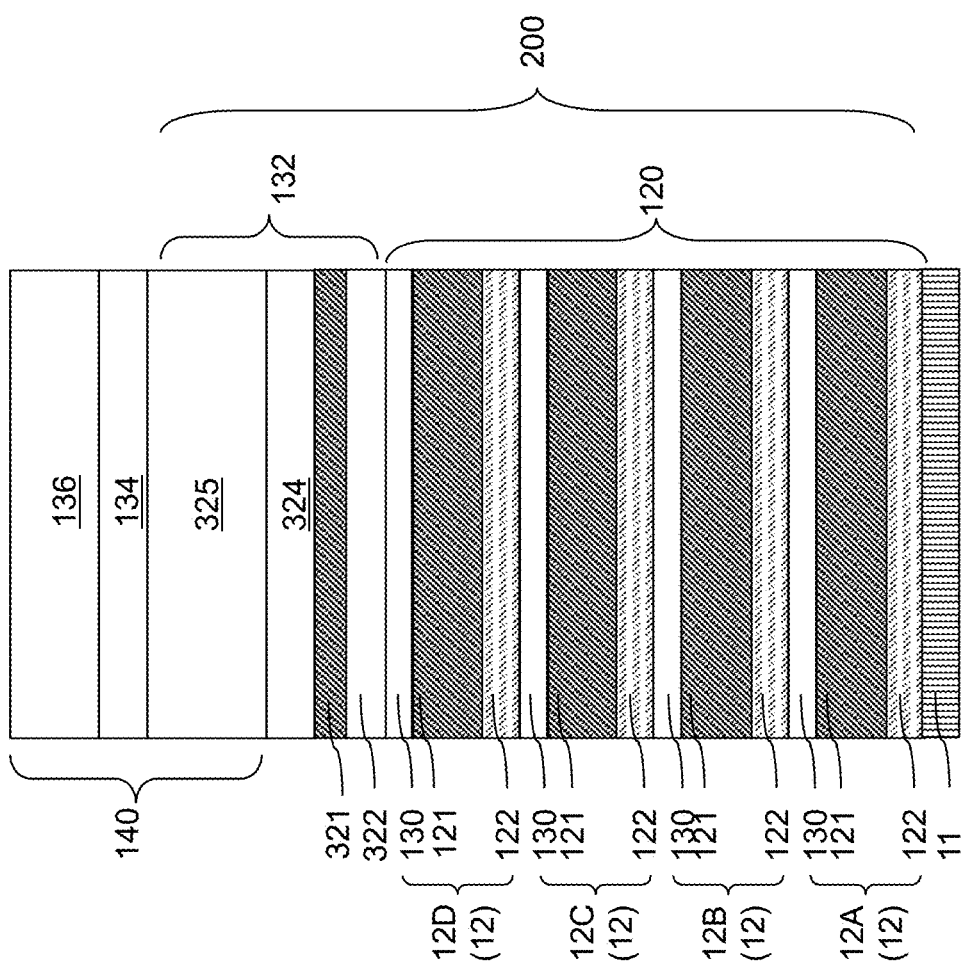

MAGNETORESISTIVE RANDOM ACCESS MEMORY CONTAINING MULTILAYER SYNTHETIC ANTIFERROMAGNETIC STRUCTURE AND METHOD OF MAKING THEREOF

FIELD

The present disclosure relates generally to the field of magnetic memory devices and specifically to a magnetoresistive random access memory device containing a multilayer synthetic antiferromagnetic structure and methods of making the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficiently large spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a magnetic memory device contains a synthetic antiferromagnetic (SAF) structure that includes an antiferromagnetically coupled stack and a reference layer. The antiferromagnetically coupled stack contains plural multilayer stacks. Each multilayer stack contains at least one ferromagnetic material layer, a non-magnetic layer and a non-magnetic SAF spacer layer having a different composition than the non-magnetic layer.

According to another aspect of the present disclosure, a method of forming a synthetic antiferromagnetic (SAF) structure of a magnetic memory device comprises depositing plural multilayer stacks over each other to form an antiferromagnetically coupled stack, wherein each multilayer stack comprises at least one ferromagnetic material layer, a non-magnetic layer and a non-magnetic SAF spacer layer having a different composition than the non-magnetic layer, and depositing a reference layer over the antiferromagnetically coupled stack.

BRIEF DESCRIPTION OF THE DRAWINGS

FIG. 2A illustrates an exemplary STT magnetoresistive memory device according to an embodiment of the present disclosure.

FIG. 2B illustrates an exemplary SOT magnetoresistive memory device according to an embodiment of the present disclosure.

FIG. 3C illustrates a third configuration for a magnetic tunnel junction and an SAF structure according to a third embodiment of the present disclosure.

DETAILED DESCRIPTION

Figure 1:
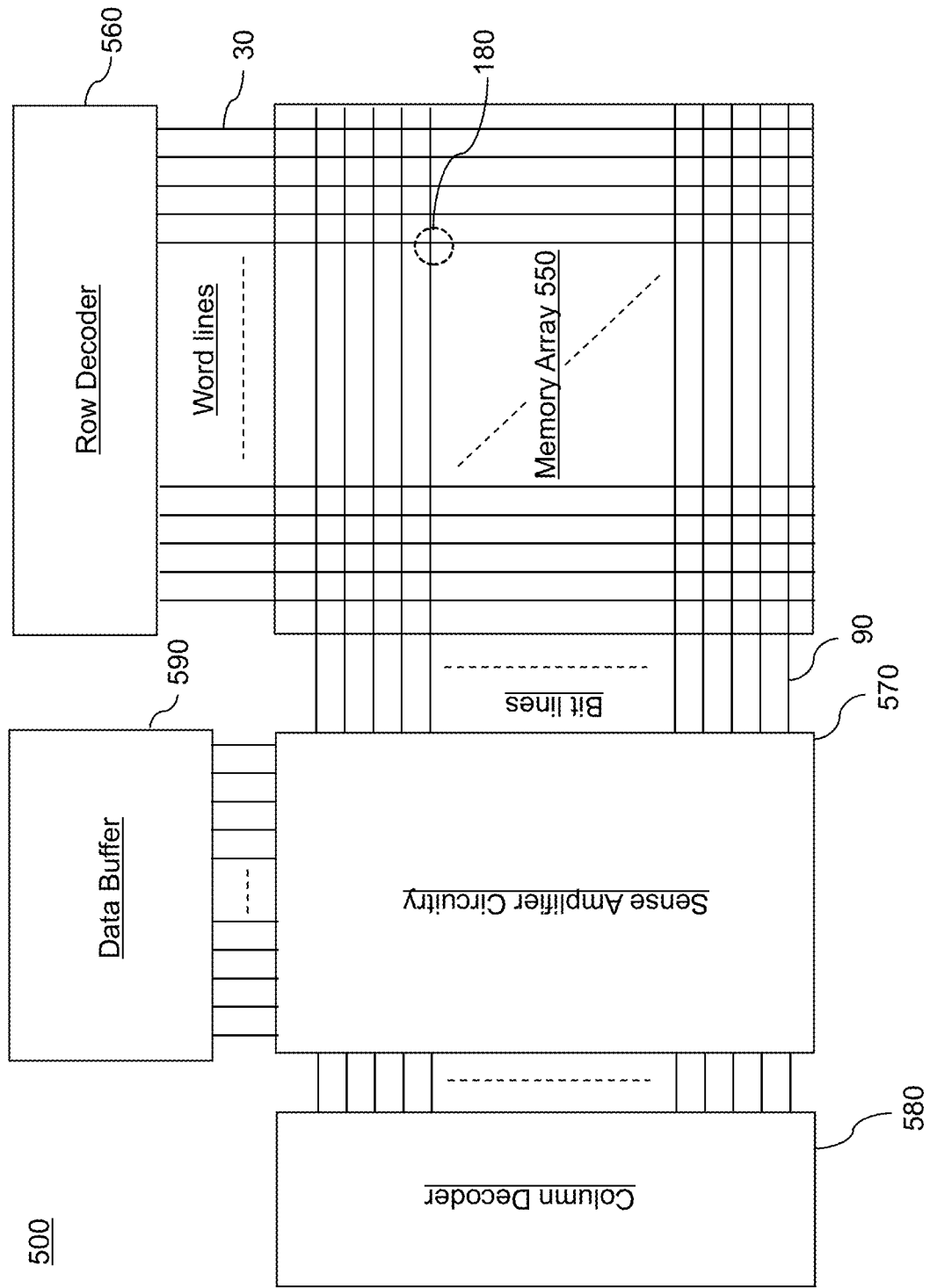
FIG. 1 is a schematic diagram of a memory device including resistive memory cells of the present disclosure in an array configuration.

The synthetic antiferromagnetic (SAF) structure or stack is a component of MRAM devices, such as STT-MRAM devices. The SAF structure may include a non-magnetic spacer layer between two ferromagnetic layers, such as a ferromagnetic reference layer and an additional ferromagnetic layer configured to stabilize one direction of magnetization in the reference layer. In the STT-MRAM device, a nonmagnetic tunnel barrier layer, such as an MgO layer may be formed between the free layer and the reference layer to form a magnetic tunnel junction (MTJ). In the SAF structure, the magnetization is fixed in one direction and provides a reference to the free layer.

A comparative example SAF structure consists of two ferromagnetic layers (e.g., hard layer (HL) and reference layer (RL)) with one non-magnetic SAF spacer, such as an iridium (Ir) or ruthenium (Ru) layer in between, which provides antiferromagnetic coupling between the two ferromagnetic layers. One comparative example of an STT-MRAM magnetic tunnel junction (MTJ) structure includes seed layer/HL/SAF spacer/RL/tunnel barrier/FL/cap layer stack. HL may be formed of a perpendicular magnetic anisotropy (PMA) multilayer stack, such as (Co/Pt)n, where n is an integer greater than 1. RL may also comprise a PMA multilayer stack, such as (Co/Pt)n stack and a ferromagnetic CoFeB or other $Co_xFe_y$ alloy layer placed on top of the PMA multilayer stack. A PMA inducing and/or crystallographic structure breaking non-magnetic reference spacer layer, such as a thin tungsten (W) layer, may be placed in the reference layer between the (Co/Pt)n multilayer stack and the ferromagnetic CoFeB layer.

Placing a ferromagnetic CoFeB layer in the vicinity of the MgO tunneling barrier may provide good tunneling magnetoresistance (TMR). TMR is generally proportional to the CoFeB layer thickness. However, as the CoFeB layer gets thicker, the PMA becomes weaker. Having the (Co/Pt)n multilayer stack and the W spacer under the CoFeB boosts PMA and allows for a thicker CoFeB layer. However, this composite RL increases the SAF structure thickness, and may lead to poor thermal annealing endurance. The SAF should be able to withstand thermal annealing up to 400 C in order to be back-end process compatible, and the comparative thicker SAF may not be able to withstand thermal annealing up to 400 C due to the poor thermal endurance.

As discussed above, the embodiments of the present disclosure are directed to an MRAM device, such as an STT-MRAM device, containing a multilayer SAF structure which includes plural non-magnetic SAF spacer layers, and methods of making the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Referring to FIG. 2A, an exemplary magnetoresistive memory device is illustrated, which may comprise one MRAM cell 180 within the magnetic memory device illustrated in FIG. 1. In one embodiment, the MRAM cell 180 may be a spin-transfer torque (STT) MRAM cell. The MRAM cell 180 of FIG. 2A can include a first terminal 32 that may be electrically connected to, or comprises, a portion of a first electrically conductive line 30 (such as a word line shown in FIG. 1) and a second terminal 92 that may be electrically connected to, or comprises, a portion of a second electrically conductive line 90 (such as a bit line shown in FIG. 1). A first electrode 62 can be connected to the first terminal 32 via an optional switch, such as a field effect transistor 110, or can be directly connected to the first terminal 32. The second terminal 92 can function as a second electrode.

Generally, the MRAM cell 180 includes a magnetic tunnel junction (MTJ) 140. The magnetic tunnel junction 140 includes a reference layer 132 (which may also be referred to as a "pinned" layer) having a fixed vertical magnetization, a nonmagnetic, dielectric tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 which may comprise a dielectric tunnel barrier layer, such as an MgO layer, and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An optional oxide capping layer 148 such as magnesium oxide may be formed on top of the free layer 136 in order to provide additional perpendicular anisotropy. However, in other embodiments, the reference layer 132 is located above the nonmagnetic tunnel barrier layer 134, while the free layer 136 is located below the nonmagnetic tunnel barrier layer 134, or the reference layer 132 and the free layer 136 may be located on opposite lateral sides nonmagnetic tunnel barrier layer 134. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The resistance change between parallel and antiparallel alignment (i.e., orientation) of the magnetization direction is called tunnel magnetoresistance (TMR).

The reference layer 132 can include either a Co/Ni or Co/Pt multilayer structure. In one embodiment, the reference layer 132 can additionally include a thin non-magnetic layer comprised of tantalum or tungsten having a thickness of 0.2 nm 0.5 nm and a thin CoFeB layer (having a thickness in a range from 0.5 nm to 3 nm). The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm. The free layer 136 can include one or more CoFeB and/or CoFe layers.

According to an embodiment of the present disclosure, the reference layer 132 may be provided as a component within a synthetic antiferromagnetic structure (SAF structure) 200. As will be discussed below, the SAF structure 200 can include a combination of an antiferromagnetically coupled stack 120 and the reference layer 132.

An oxide capping layer 148 such as magnesium oxide can be optionally formed over the free layer 136. In one embodiment, the magnesium oxide capping layer 148 can have a thickness in a range from 4 Angstroms to 10 Angstroms, although lesser and greater thicknesses can also be employed. Thus, the magnesium oxide capping layer 148 has a resistance-area product that is negligible or much smaller than the resistance-area product of the tunnel barrier layer 134. There may not be a ferromagnetic electrode on top of the magnesium oxide capping layer 148. Thus, the MRAM cell 180 can be a single tunnel junction device that includes only one magnetic tunnel junction 140.

A non-magnetic electrically conductive layer 150 can be formed on the magnesium oxide capping layer 148. The non-magnetic electrically conductive layer 150 includes at least one non-magnetic electrically conductive material such as tantalum, ruthenium, tantalum nitride, copper, and/or copper nitride. For example, the non-magnetic electrically conductive layer 150 can comprise a single layer or a layer stack including, from one side to another, a first ruthenium layer, a tantalum layer, and a second ruthenium layer. For example, the first ruthenium layer can have a thickness in a range from 5 Angstroms to 15 Angstroms the tantalum layer can have a thickness in a range from 10 Angstroms to 30 Angstroms and the second ruthenium layer can have a thickness in a range from 5 Angstroms to 15 Angstroms.

In one embodiment, a nonmagnetic capping layer 170 can be formed over the non-magnetic electrically conductive layer 150. The nonmagnetic capping layer 170 can include a non-magnetic, electrically conductive material, such as W, Ti, Ta, WN, TiN, TaN, Ru, and Cu. The thickness of the nonmagnetic capping layer 170 can be in a range from 1 nm to 30 nm, although lesser and greater thicknesses can also be employed.

Thus, the MRAM cell 180 including the SAF structure 200, the magnetic tunnel junction 140, the optional magnesium oxide capping layer 148, the optional non-magnetic electrically conductive layer 150, and the optional nonmagnetic capping layer 170. The MRAM cell 180 may be annealed to induce crystallographic alignment between the crystalline structure of the nonmagnetic tunnel barrier layer 134 (which may include crystalline MgO having a rock salt crystal structure) and the crystalline structure within the free layer 136.

The location of the first and second terminals may be switched such that the first terminal is electrically connected to the SAF structure 200 and the second terminal is electrically connected to the capping layer 170. The layer stack including the material layers from the SAF structure 200 to the nonmagnetic capping layer 170 can be deposited in reverse order, i.e., from the SAF structure 200 toward the nonmagnetic capping layer 170 or from the nonmagnetic capping layer 170 toward the SAF structure 200. The layer stack can be formed as a stack of continuous layers, and can be subsequently patterned into discrete patterned layer stacks for each MRAM cell 180.

Optionally, each MRAM cell 180 can include a dedicated steering device, such an access transistor 110 or diode configured to activate a respective discrete patterned layer stack (200, 140, 148, 150, 170) upon application of a suitable voltage to the steering device. The steering device may be electrically connected between the patterned layer stack and one of the respective word lines or bit lines of the respective MRAM cell 180.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (200, 140, 148, 150, 170) are also contemplated herein.

The magnetization direction of the free layer 136 can be flipped (i.e., from upward to downward or vice versa) by flowing electrical current through the discrete patterned layer stack (200, 140, 148, 150, 170). The magnetization of the free layer 136 can precess around the vertical direction (i.e., the direction of the flow of the electrical current) during the programming process until the spin transfer torque exerted by the spin-polarized electrical current flips the direction of the magnetization by 180 degrees, at which point the flow of the electrical current can be stopped.

Referring to FIG. 2B, an exemplary spin orbit torque (SOT) magnetoresistive memory device is illustrated, which may comprise one MRAM cell 180 within the magnetic memory device illustrated in FIG. 1. The MRAM cell 180 of FIG. 2B can include a first terminal 32 that may be electrically connected to, or comprises, a portion of a first electrically conductive line 30 (such as a word line shown in FIG. 1), a second terminal 92 that may be electrically connected to, or comprises, a portion of a second electrically conductive line 90 (such as a bit line shown in FIG. 1), and a third terminal 82 that may be electrically grounded or may be electrically connected to a portion of a third electrically conductive line. The third electrically conductive line may be an access line controlled by an access line decoder that may be added to the MRAM device of FIG. 1. A first electrode 62 can be connected to the first terminal 32 via an optional switch, such as a field effect transistor 110, or can be directly connected to the first terminal 32. The second terminal 92 can function as a second electrode.

The exemplary SOT magnetoresistive memory device of FIG. 2B can be derived from the exemplary STT magnetoresistive memory device of FIG. 2A by replacing the layer stack of a magnesium oxide capping layer 148, a nonmagnetic electrically conductive layer 150, and a nonmagnetic capping layer 170 with a spin orbit transfer (SOT) layer 250 that is employed to assist flipping of the magnetization in the free layer 136. The second terminal 92 can be attached to one end of the SOT layer 250, and the third terminal 82 can be attached to another end of the SOT layer 250 that is located at an opposite side of the second terminal 92.

The SOT layer 250 includes a nonmagnetic heavy metal that provides strong spin-orbit coupling with, and in contact with, the free layer 136. For example, the SOT layer 250 can include, and/or can consist essentially of, Pt, Ta, W, Hf, Ir, Re, Os, Au, CuBi, CuIr, AuPt, AuW, PtPd, and/or PtMgO. The strong spin-orbit coupling between the SOT layer 250 and the free layer 136 induce switching of the magnetization direction in the free layer when electrical current flows in the SOT layer 250 in a direction that is parallel to the interface between the free layer 136 and the SOT layer 250. When an electric write current laterally passes through the SOT layer 250, spin current is generated in a direction perpendicular to the electrical current via the spin Hall effect (SHE). The spin current exerts a torque on the magnetization of the magnetic layer, i.e., the free layer 136. Thus, the SOT layer 250 assists in the transition of the magnetization direction in the free layer 136 through the spin Hall effect. Thus, the SOT layer 250 is also referred to as metallic assist layer, i.e., a metallic layer that assists the magnetic transition in the free layer 136.

Generally, a MRAM cell 180 (e.g., STT or SOT MRAM cell) within the magnetic memory device (e.g., MRAM device) 500 of FIG. 1 can include a nonmagnetic tunnel barrier layer 134 located between the reference layer 132 and the free layer 136. The reference layer 132, the nonmagnetic tunnel barrier layer 134, and the free layer 136 constitute a magnetic tunnel junction 140 having a variable magnetoresistance that depends on relative orientation of magnetizations of the reference layer 132 and the free layer 136. In one embodiment, the magnetic memory device 500 comprises a spin-transfer torque magnetoresistive random access memory device comprising multiple STT MRAM cells 180 containing the magnetic tunnel junction 140 and the SAF structure 200. In another embodiment, the magnetic memory device 500 comprises a spin-orbit torque magnetoresistive random access memory device comprising multiple SOT MRAM cells 180 containing the magnetic tunnel junction 140 and the SAF structure 200.

The fixed magnetization of the reference layer 132 should remain unchanged during operation of the magnetic memory device. External factors that can induce changes in the fixed magnetization in the reference layer 132 include, among others, thermal agitation of magnetic moments of the ferromagnetic material in the reference layer 132 and/or fluctuations in the ambient magnetic field during operation of the magnetic memory device. Thus, enhancing stability of the fixed magnetization in the reference layer 132 increases the stability of the magnetic tunnel junction 140 within a magnetic memory device.

Figure 3A:
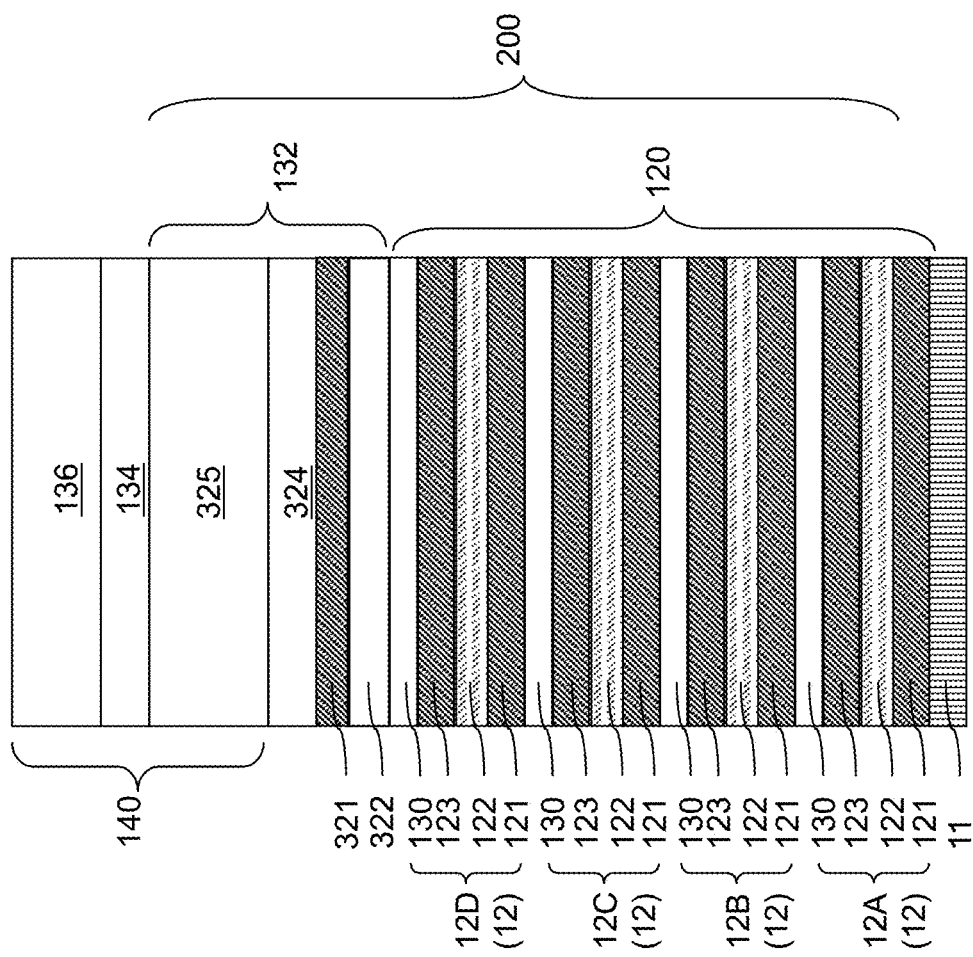
FIG. 3A illustrates a first configuration for a magnetic tunnel junction and an SAF structure according to a first embodiment of the present disclosure.
Figure 3B:
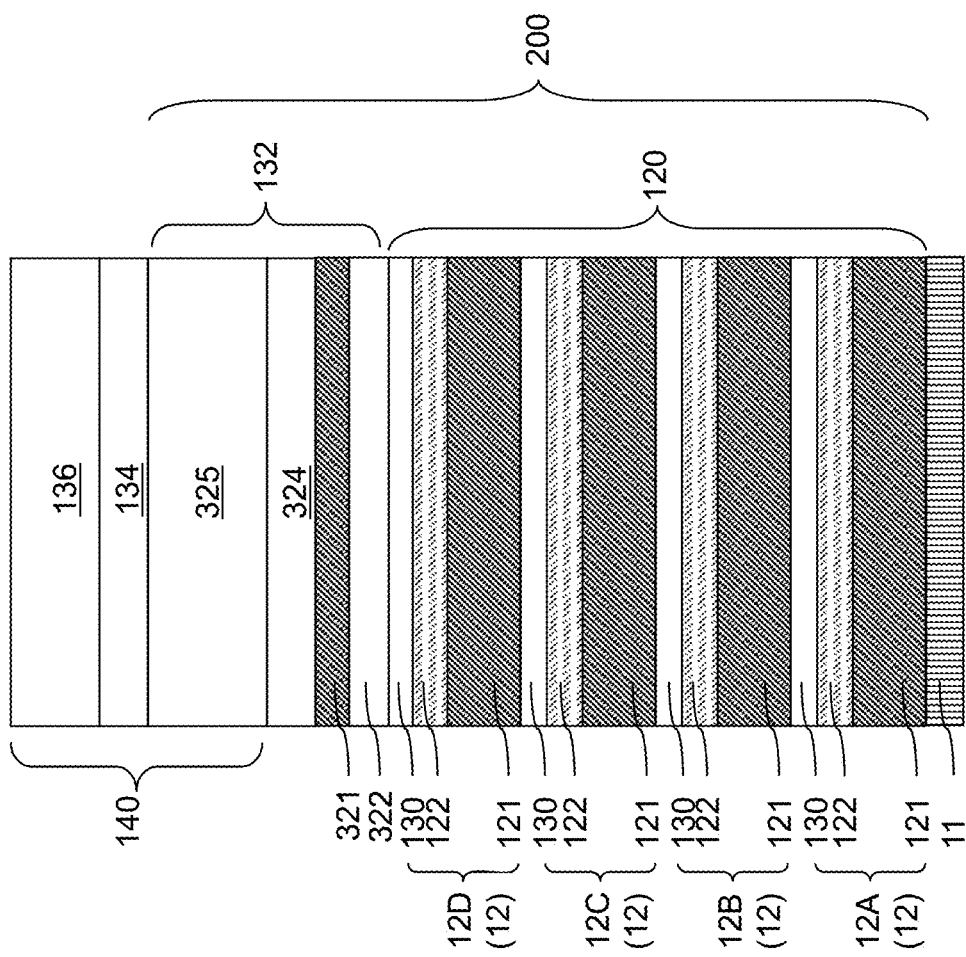
FIG. 3B illustrates a second configuration for a magnetic tunnel junction and an SAF structure according to a second embodiment of the present disclosure.
Figure 3D:
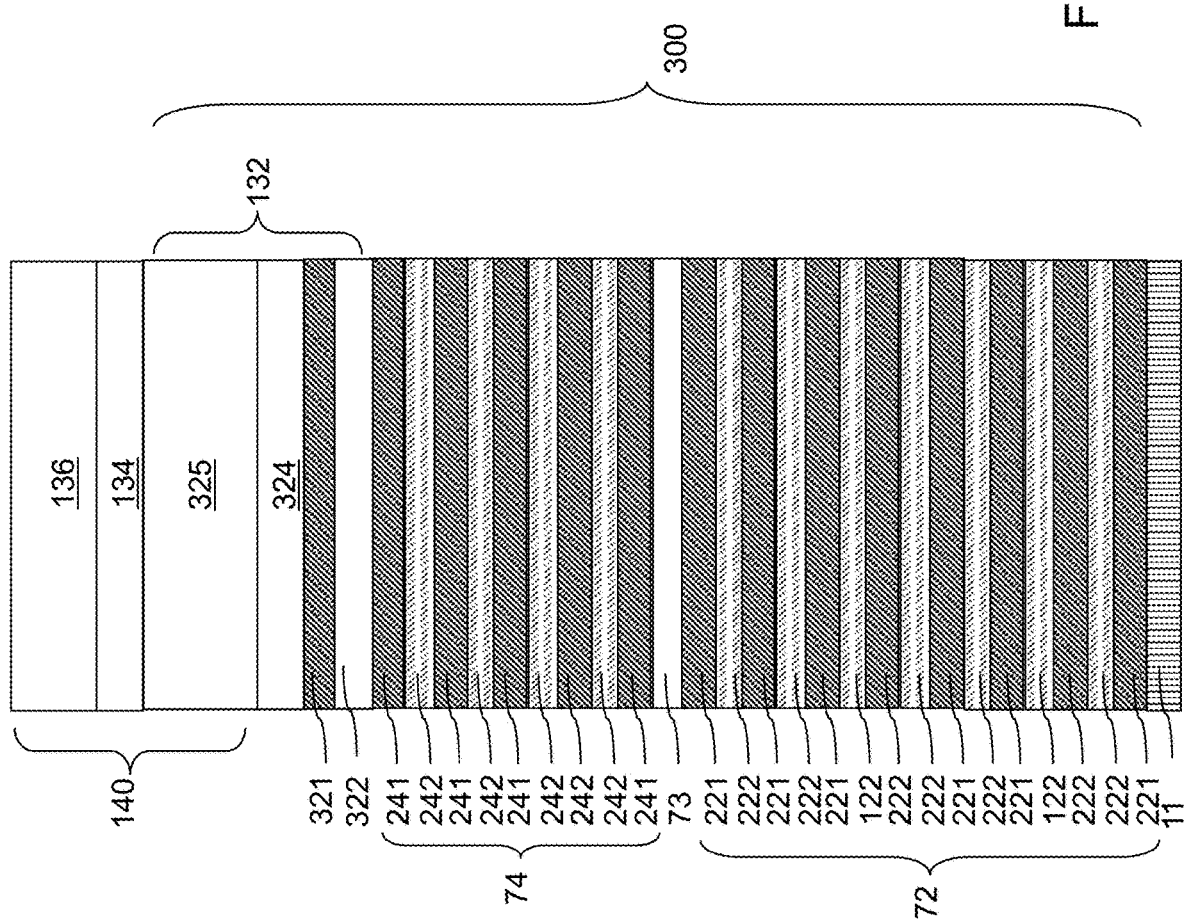
FIG. 3D illustrates a comparative exemplary configuration of a magnetic tunnel junction and an SAF structure.

FIGS. 3A-3C illustrate various configurations of an MRAM cell 180 containing an antiferromagnetically coupled stack 120 containing plural SAF spacer layers 130 within a SAF structure 200 according to embodiments of the present disclosure. FIG. 3D illustrates a comparative example of an MRAM cell 180 containing a SAF structure 200 with a single SAF spacer layer 130. According to an aspect of the present disclosure, stability of the fixed magnetization in a reference layer 132 can be enhanced by using an antiferromagnetically coupled stack 120 containing plural SAF spacer layers 130 in a SAF structure 200.

As used herein, an antiferromagnetically coupled stack 120 is a stack of at least two multilayer units 12, in which each multilayer unit 12 includes at least one ferromagnetic material layer 121, at least one non-magnetic layer 122 and at least one non-magnetic SAF spacer layer 130 having a different composition than the non-magnetic layer 122. The non-magnetic layer 122 and the non-magnetic SAF spacer layer 130 preferably comprise electrically conductive (i.e., "metallic") layers (e.g., metal or metal alloy layers) having a different composition from each other. In other words, each multilayer unit 12 may be a combination of a PMA multilayer stack (121, 122) and a SAF spacer layer 130. Each multilayer unit 12 may have a configuration selected from a first configuration $(FM/NM/FM/NMS)_n$ shown in FIG. 3A, a second configuration $(FM/NM/NMS)_n$ shown in FIG. 3B, or a third confirmation $(NM/FM/NMS)_n$ shown in FIG. 3C. In these configurations, n is an integer greater than 1 (e.g., 2 to 20, such as 4 to 8) and denotes the number of unit cells 12 in each antiferromagnetically coupled stack 120, FM denotes a ferromagnetic layer 121, FM1 and FM2 denote first and second ferromagnetic layers 121 and 123 respectively, which may have the same or different composition from each other, NM denotes the non-magnetic layer 122, and NMS denotes the non-magnetic SAF spacer layer 130 which has different composition from the non-magnetic layer 122.

In the embodiments shown in FIGS. 3A-3C, the SAF structure 200 includes an antiferromagnetically coupled stack 120 formed over a nonmagnetic metallic seed layer 11, and a reference layer 132 formed over the antiferromagnetically coupled stack 120. The metallic seed layer 11 can be provided on a substrate (not shown) that provides structural support to material layers thereupon. The metallic seed layer 11 can include at least one material selected from Ti, Ta, Pt, Ni, Cr, Ru or a NiCr alloy. The antiferromagnetically coupled stack 120 can be formed by depositing plural multilayer units 12 over the seed layer. Each multilayer stack 12 comprises at least one ferromagnetic material layer (121, 123), a non-magnetic layer 122 that contacts each of the at least one ferromagnetic material layer (121, 123), and the SAF spacer layer 130. In one embodiment, in each multilayer stack 12, the SAF spacer layer 130 is more distal from the nonmagnetic metallic seed layer 11 than the PMA multilayer stack of the at least one ferromagnetic material layer (121, 123) and the non-magnetic layer 122. In an alternative embodiment, the layers may be deposited in the opposite order (e.g., the reference layer 132 formed on the tunneling barrier layer 134, the antiferromagnetically coupled stack 120 formed on the reference layer 134 and a cap layer (instead of the seed layer) formed on the antiferromagnetically coupled stack 120).

The reference layer 132 can be formed over the last multilayer stack 12, i.e., over the topmost multilayer stack 12 that terminates with a last instance of the SAF spacer layer 130. Each SAF spacer layer 130 provides antiferromagnetic coupling between ferromagnetic materials of multilayer stacks 12 or between a ferromagnetic material of the top multilayer stack 12 and a ferromagnetic material of the reference layer 132.

Generally, a magnetic memory device (e.g., MRAM device) according to embodiments of the present disclosure can include a synthetic antiferromagnetic structure 200 that includes an antiferromagnetically coupled stack 120 and a reference layer 132. The antiferromagnetically coupled stack 120 comprises plural, repeating multilayer stacks 12. Each multilayer stack 12 comprises at least one ferromagnetic material layer (121, 123), a non-magnetic layer 122 that contacts each of the at least one ferromagnetic material layer (121, 123), and SAF spacer layer 130. The reference layer 132 is located adjacent to (e.g., over) the last SAF spacer layer 130.

The reference layer 132 provides a stable fixed magnetization that is stabilized by the two or more multilayer stacks 12. Increasing the total number of the multilayer stacks 12 increases the stability of the fixed magnetization of the reference layer 132. However, increasing the total number of the multilayer stacks 12 also increases the total thickness of the SAF structure 200. In one embodiment, the number of the multilayer stacks 12 may be in a range from 2 to 20, i.e., any number selected from 2, 3, 4, 5, 6, 7, 8, 9, 10, 11, 12, 13, 14, 15, 16, 17, 18, 19, or 20. In one embodiment, the number of the multilayer stacks 12 may be in a range from 4 to 8. The embodiments shown in FIGS. 3A-3C include four multilayer stacks 12 (i.e., 12A, 12B, 12C and 12D). However, there may be more or less than four multilayer stacks 12. In one embodiment, each of the multilayer stacks 12 can be the same. In another embodiment, two or more types of multilayer stacks 12 may be employed to tune the magnetic moment imbalance of the SAF structure 200 to compensate for the additional magnetic moment of the reference layer 132. For example, the multilayer stack 12A is different from the multilayer stack 12B.

In one embodiment, each ferromagnetic material layer (121, 123) within each multilayer stack 12 can comprise, and/or can consist essentially of, cobalt, an alloy of cobalt and iron, or an alloy of cobalt, iron, and boron ("CoFeB"). In one embodiment, the SAF spacer layer 130 within each multilayer stack 12 comprises iridium, ruthenium, or chromium. In one embodiment, the non-magnetic layer 122 within each multilayer stack 12 can comprise, and/or can consist essentially of, at least one material selected from platinum, palladium, rhodium, molybdenum, osmium, or vanadium. Preferably, but not necessarily, the composition of the non-magnetic layer 122 is the same in all multilayer stacks 12. Alternatively, at least one non-magnetic layer 122 in one multilayer stack 12 may have a different composition from one or more other non-magnetic layers 122 in one or more other multilayer stacks 12.

Each layer within the antiferromagnetically coupled stack 120 can be deposited by a conformal deposition process or a non-conformal deposition process. For example, each layer within the antiferromagnetically coupled stack 120 can be deposited by a respective physical vapor deposition process, e.g., by a respective sputtering process. In one embodiment, each of the at least one ferromagnetic material layer (121, 123), the non-magnetic layer 122, and the SAF spacer layer 130 has a thickness in a range from 1 Angstrom to 6 Angstroms, such as 2 to 4 Angstroms.

In a first configuration of the antiferromagnetically coupled stack 120 according to a first embodiment illustrated in FIG. 3A, the at least one ferromagnetic material layer (121, 123) within each multilayer stack 12 includes a first ferromagnetic material layer 121 and a second ferromagnetic material layer 123. In this embodiment, each multilayer stack 12 is formed by sequentially depositing the first ferromagnetic material layer 121, the non-magnetic layer 122, the second ferromagnetic material layer 123, and the SAF spacer layer 130. Thus, in each multilayer stack 12, the non-magnetic layer 122 is deposited directly on the first ferromagnetic material layer 121, the second ferromagnetic material layer 123 is deposited directly on the non-magnetic layer 122, and the SAF spacer layer 130 is deposited directly on the second ferromagnetic material layer 123.

Each first ferromagnetic material layer 121 includes a proximal surface and a distal surface that are parallel to an interface between the antiferromagnetically coupled stack 120 and the reference layer 132. Likewise, each second ferromagnetic material layer 123 includes a proximal surface and a distal surface that are parallel to an interface between the antiferromagnetically coupled stack 120 and the reference layer 132. As used herein, a "proximal surface" of any element within an antiferromagnetically coupled stack 120 refers to an element that is more proximal to the interface between the antiferromagnetically coupled stack 120 and the reference layer 132, and a "distal surface" of any element within an antiferromagnetically coupled stack 120 refers to an element that is more distal from the interface between the antiferromagnetically coupled stack 120 and the reference layer 132. The at least one ferromagnetic material layer (121, 123) within each multilayer stack 12 illustrated in FIG. 3A can include a first ferromagnetic material layer 121 that contacts a distal surface of the non-magnetic layer 122 and a second ferromagnetic material layer 123 that contacts a proximal surface of the non-magnetic layer 122.

In one embodiment, the first ferromagnetic material layer 121 can include a first cobalt layer, and the second ferromagnetic material layer 123 can include a second cobalt layer. In one embodiment, the multilayer stack 12 consists of, from one side to another, a first cobalt layer as the first ferromagnetic material layer 121, a platinum layer as the non-magnetic layer 122, a second cobalt layer as the second ferromagnetic material layer 123, and an iridium layer as the SAF spacer layer 130.

In a second configuration of the antiferromagnetically coupled stack 120 according to a second embodiment illustrated in FIG. 3B, the at least one ferromagnetic material layer 121 within each multilayer stack 12 consists of a single ferromagnetic material layer 121, the non-magnetic layer 122 is deposited directly on the single ferromagnetic material layer 121, and the SAF spacer layer 130 is deposited directly on the non-magnetic layer 122. In this case, each single ferromagnetic material layer 121 can contact a distal surface of the non-magnetic layer 122 within the same multilayer stack 12. A proximal surface of the non-magnetic layer 122 can contact a distal surface of the SAF spacer layer 130 of the same multilayer stack 12.

In a third configuration of the antiferromagnetically coupled stack 120 according to a third embodiment illustrated in FIG. 3C, the at least one ferromagnetic material layer 121 within multilayer stack 12 consists of a single ferromagnetic material layer 121 that is deposited directly on the non-magnetic layer 122, and the SAF spacer layer 130 is deposited directly on the single ferromagnetic material layer 121. Thus, the positions of layers 121 and 122 in the multilayer stack 12 of the third embodiment are reversed compared to those of the second embodiment. The single ferromagnetic material layer 121 contacts a proximal surface of the non-magnetic layer 122 and a distal surface of the SAF spacer layer 130 in each multilayer stack 12. A distal surface of the non-magnetic layer 122 is more distal from the reference layer 132 than the proximal surface of the non-magnetic layer 122 is from the reference layer 132.

In each of the first, second and third embodiments, the antiferromagnetically coupled stack 12 includes two through 20 multilayer stacks 12. Each multilayer stack 12 other than the top and the bottom multilayer stacks contacts two other multilayer stacks 12.

The reference layer 132 of the first, second and third embodiments can include a stack of multiple layers configured to enhance stability of the magnetization therein. In one embodiment, the reference layer 132 can include a first non-magnetic reference spacer layer 322 located over the SAF spacer layer 130 of the last (e.g., top) multilayer stack 12, a first reference ferromagnetic layer 321 located over the first non-magnetic reference spacer layer 322, a second non-magnetic reference spacer layer 324 located over the first reference ferromagnetic layer 321, and a second reference ferromagnetic layer 325 located over the second non-magnetic reference spacer layer 324.

In an alternative embodiment, the SAF spacer layer 130 within the most proximal multilayer stack 12D within the antiferromagnetically coupled stack 120 may be omitted. In this case, the reference layer 132 can be ferromagnetically coupled to the first cobalt ferromagnetic material layer 121 or to the second cobalt ferromagnetic material layer 121 within the antiferromagnetically coupled stack 120.

In one embodiment, the first reference ferromagnetic layer 321 can have the same material composition as the second reference ferromagnetic layer 325. The first reference ferromagnetic layer 321 and the second reference ferromagnetic layer 325 may each comprise CoFeB and/or a cobalt iron alloy. The first and second non-magnetic reference spacer layers (322, 324) may comprise a non-magnetic material that provides a crystallographic structure that induces perpendicular magnetic anisotropy in the second reference ferromagnetic layer 325. For example, the first and second non-magnetic reference spacer layers (322, 324) can comprise a tungsten layer having a thickness in a range from 1 Angstrom to 6 Angstroms.

Referring to FIG. 3D, a comparative exemplary configuration of an MRAM cell 180 containing a magnetic tunnel junction 140 and a comparative SAF structure 300 is illustrated. The SAF structure 300 in the comparative exemplary configuration includes a first ferromagnetically coupled alternating layer stack 72 that functions as a hard layer, a SAF spacer layer 73, a second ferromagnetically coupled alternating layer stack 74, first and second non-magnetic reference spacer layer (322, 324) and first and second reference ferromagnetic layers (321, 325).

The first ferromagnetically coupled alternating layer stack 72 includes seven PMA multilayer stacks (221, 222) that each includes a cobalt ferromagnetic material layer 221 and a platinum non-magnetic layer 222. An extra cobalt ferromagnetic material layer 221 is added over the PMA multilayer stack. The SAF spacer layer 73 comprises iridium. The second ferromagnetically coupled alternating layer stack 74 includes multiple PMA multilayer stacks (241, 242) that each includes a cobalt ferromagnetic material layer 241 and a platinum non-magnetic layer 242. An extra cobalt ferromagnetic material layer 241 is over the PMA multilayer stack.

Samples (referred to as "first samples" hereafter) of the first configuration of the SAF structure 200 illustrated in FIG. 3A and samples (referred to as "second samples" hereafter) of the comparative exemplary configuration of a SAF structure 300 illustrated in FIG. 3D are annealed at various temperatures.

Specifically, the first samples of the SAF structure 200 illustrated in FIG. 3A include an antiferromagnetically coupled stack 120 containing four multilayer stacks 12 and a reference layer 132. Each multilayer stack 12 includes a first cobalt ferromagnetic material layer 121, a platinum non-magnetic layer 122, a second cobalt ferromagnetic material layer 123, and an iridium SAF spacer layer 130. The reference layer 132 includes CoFeB first and second reference ferromagnetic layers (321, 325) and tungsten first and second the non-magnetic reference spacer layers (322, 324).

The first samples and the second samples are annealed at different temperatures, and the magnetic characteristics of the SAF structure 200 in the first samples and the SAF structure 300 in the second samples are measured. FIGS. 4A-4H illustrate the magnetic moment of the reference layers 132 as a function of an externally applied magnetic field along a vertical direction.

Figure 4A:
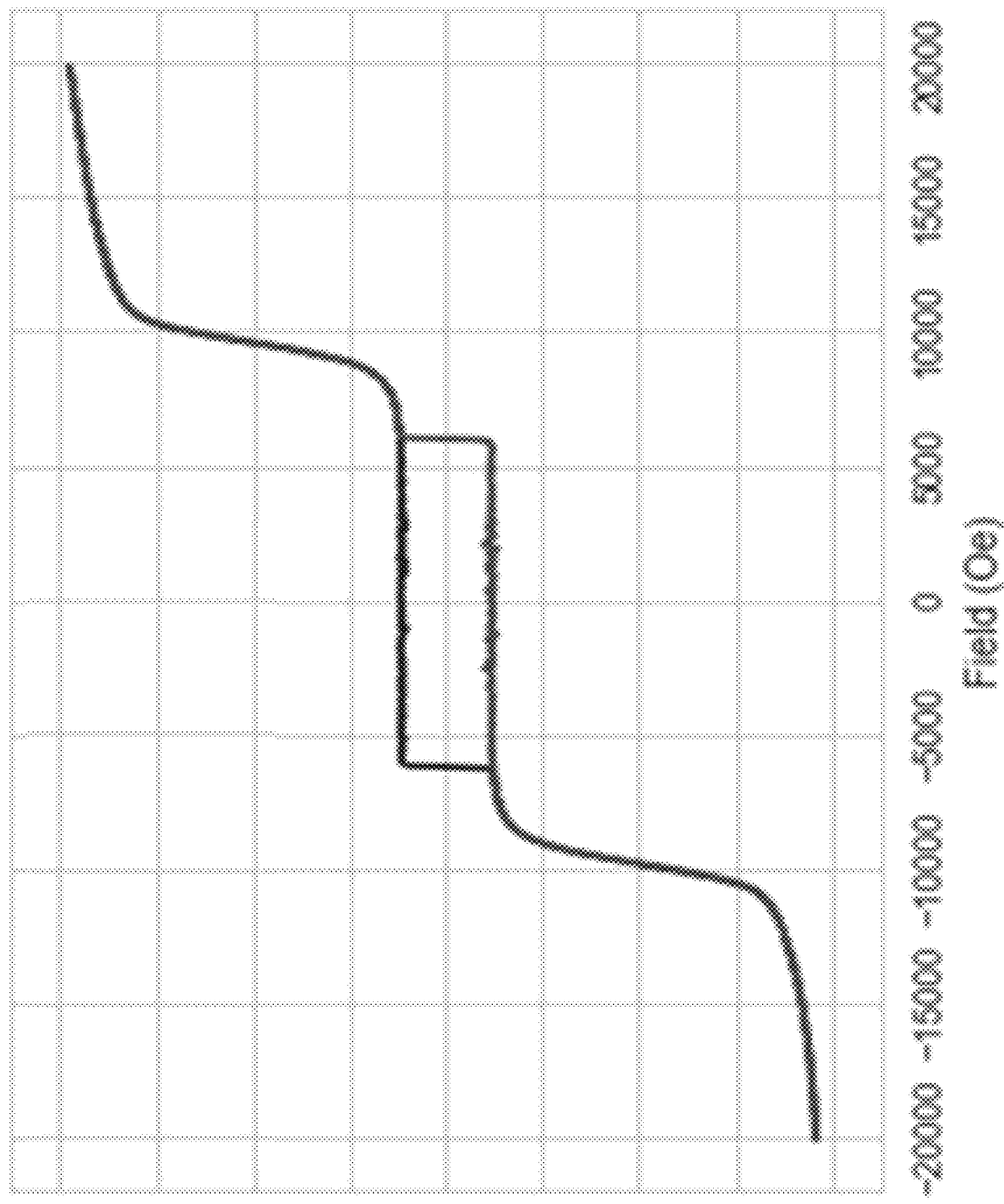
FIG. 4A illustrates magnetic moment of a reference layer as a function of an external applied field in a sample including the SAF structure of FIG. 3D after an anneal at 335 degrees Celsius.
Figure 4B:
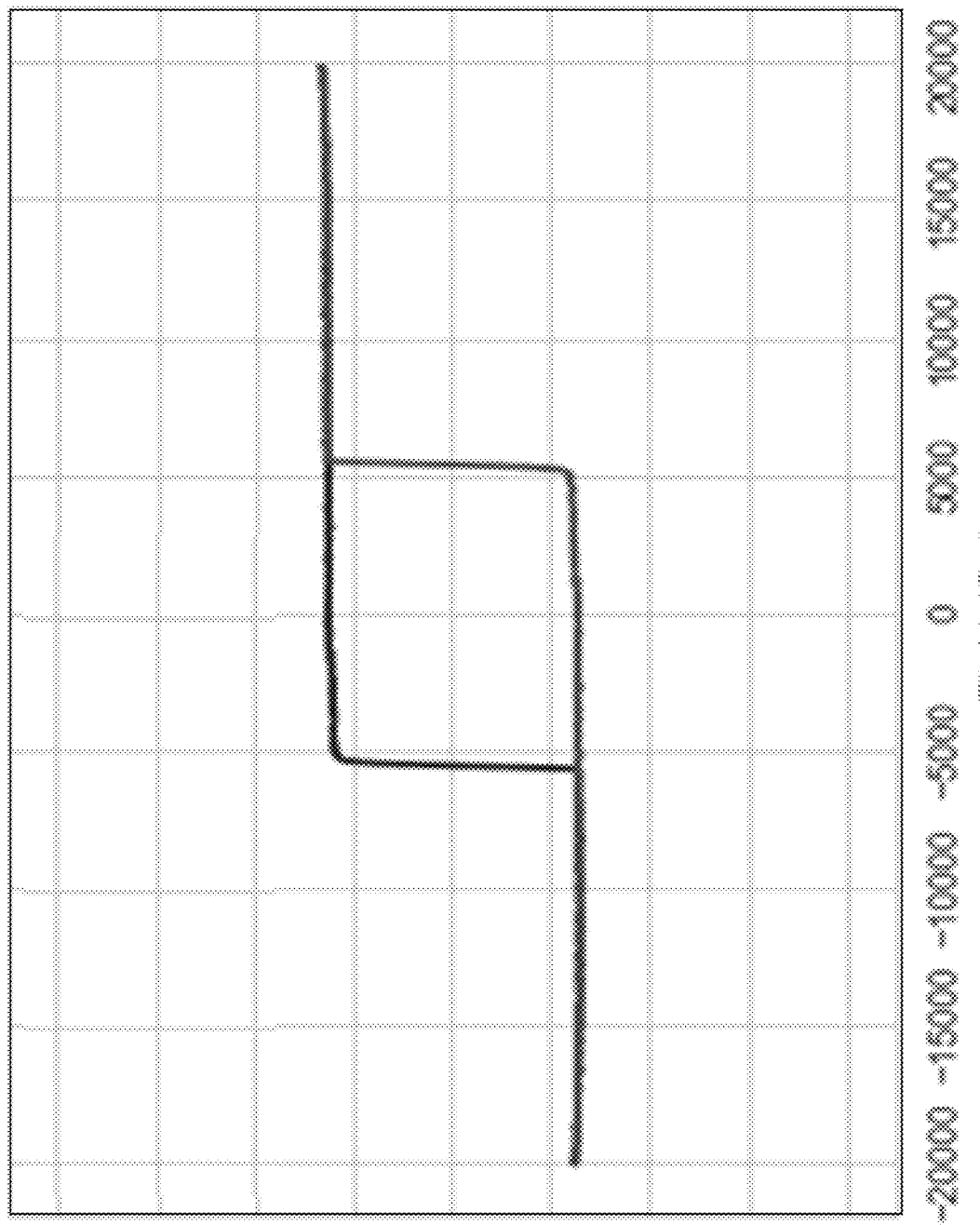
FIG. 4B illustrates magnetic moment of a reference layer as a function of an external applied field in a sample including the SAF structure of FIG. 3A after an anneal at 335 degrees Celsius.

FIG. 4A illustrates a magnetic hysteresis curve for a second sample after an anneal at 335 degrees Celsius. FIG. 4B illustrates a magnetic hysteresis curve for a first sample after an anneal at 335 degrees Celsius. The magnetization of the reference layer 132 in an SAF structure 200 of the first configuration of the exemplary structure of the present disclosure flips when the external magnetic field strength reaches 5 kOe in the case of the first sample, and no rotation of the magnetization occurs up to the external magnetic field strength of up to 20 kOe for the first sample. In contrast, the magnetization of the reference layer in an SAF structure 300 of a comparative exemplary structure rotates when the external magnetic field strength reaches 10 kOe.

Figure 4C:
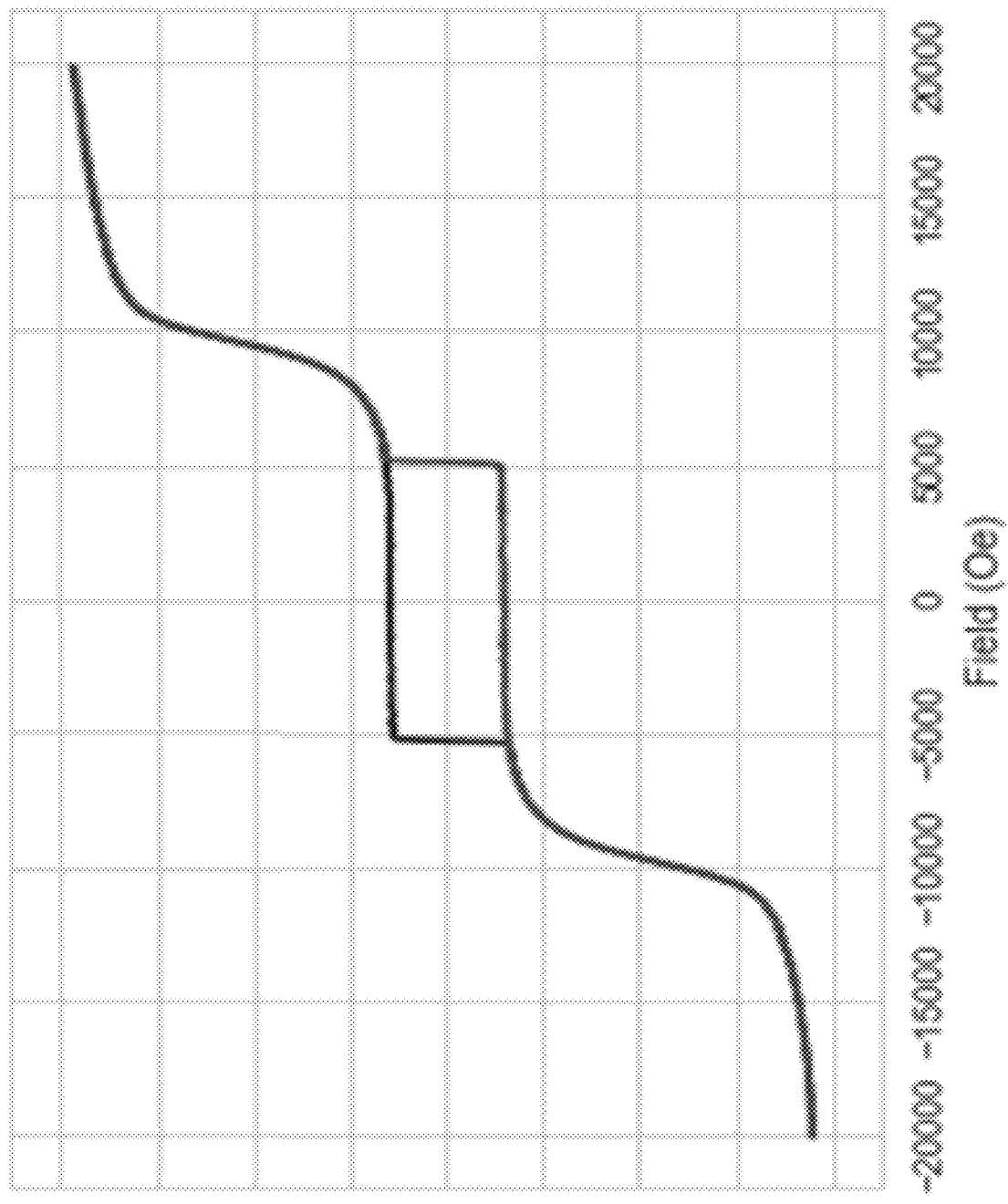
FIG. 4C illustrates magnetic moment of a reference layer as a function of an external applied field in a sample including the SAF structure of FIG. 3D after an anneal at 350 degrees Celsius.
Figure 4D:
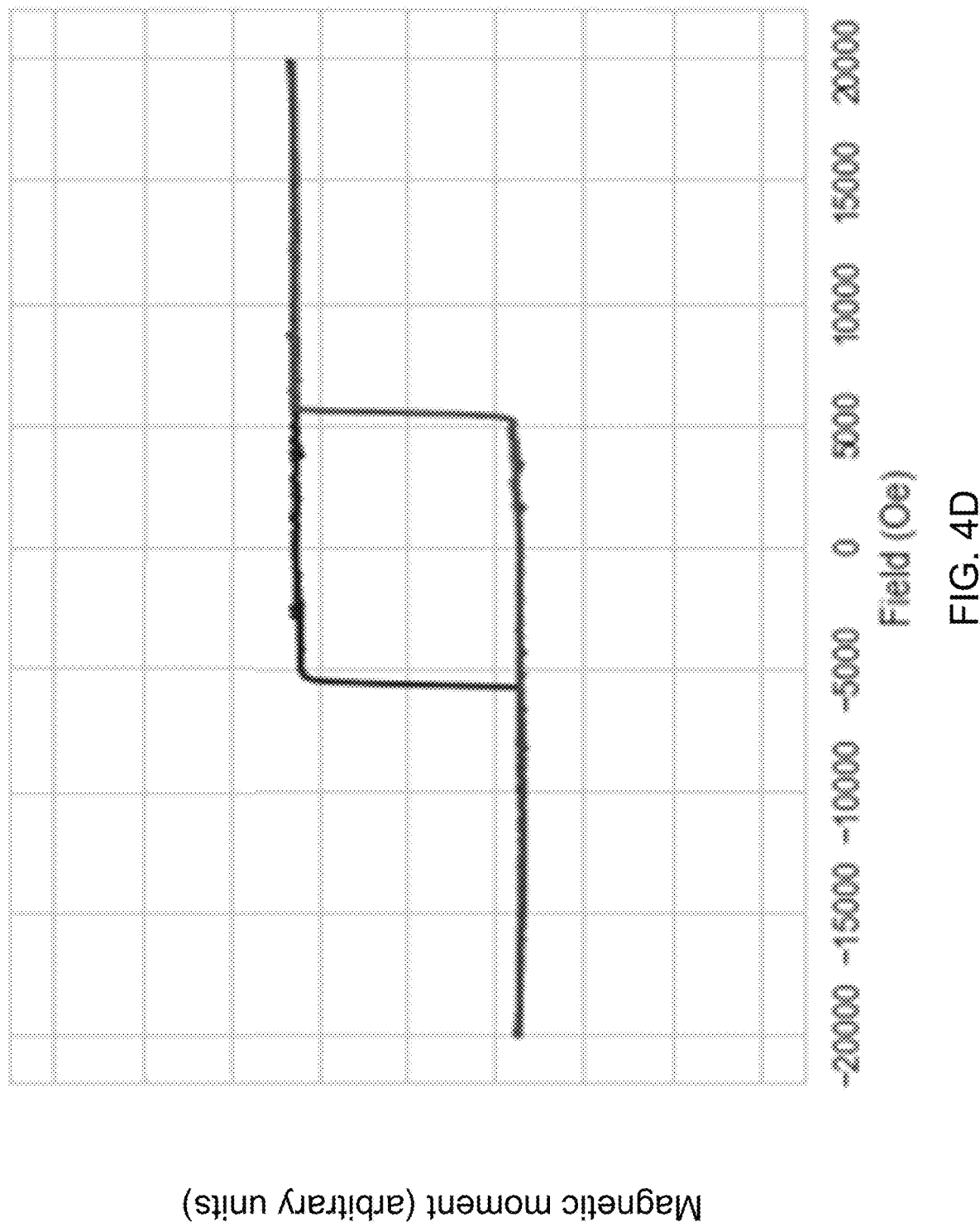
FIG. 4D illustrates magnetic moment of a reference layer as a function of an external applied field in a sample including the SAF structure of FIG. 3A after an anneal at 350 degrees Celsius.
Figure 4E:
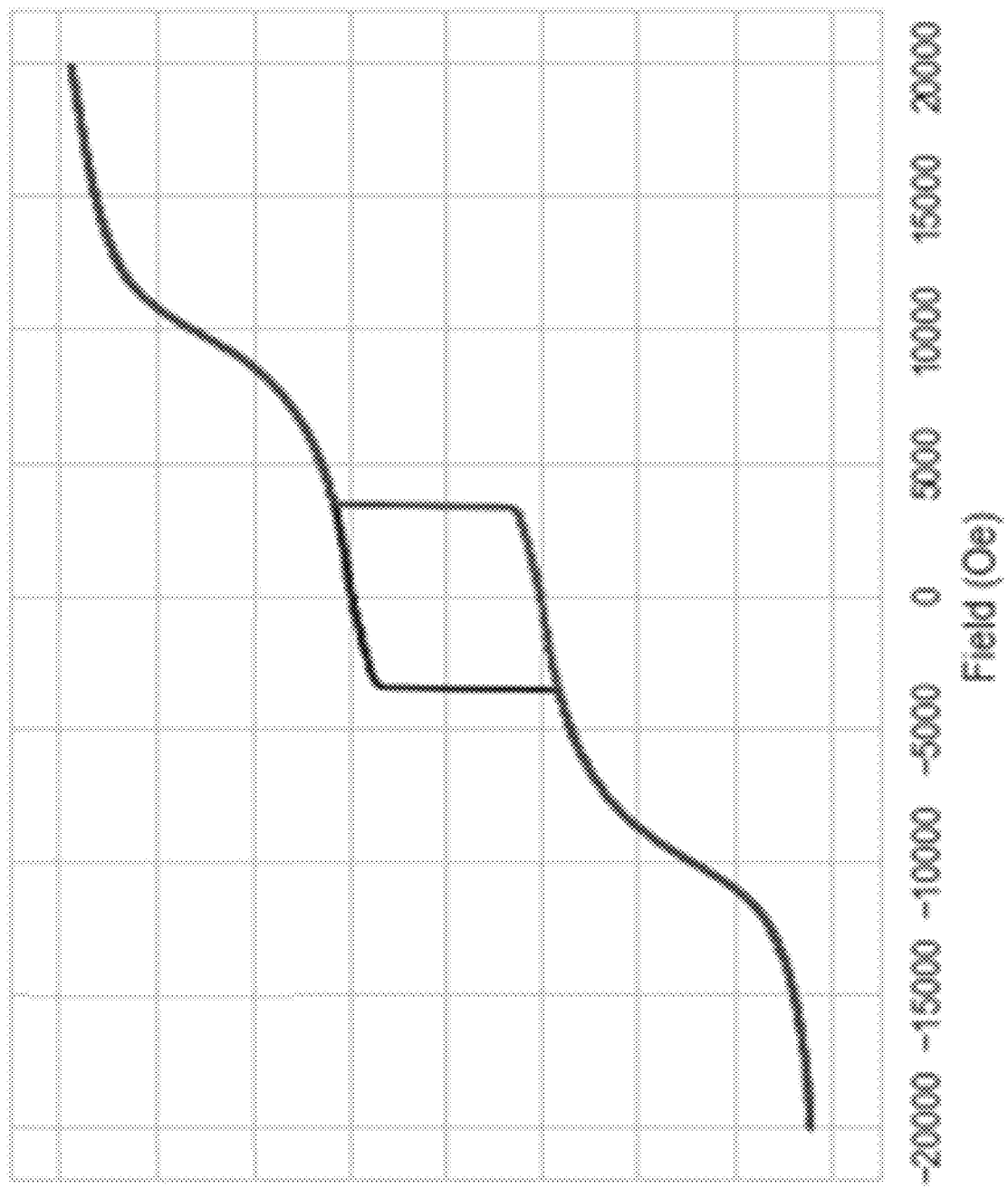
FIG. 4E illustrates magnetic moment of a reference layer as a function of an external applied field in a sample including the SAF structure of FIG. 3D after an anneal at 375 degrees Celsius.
Figure 4F:
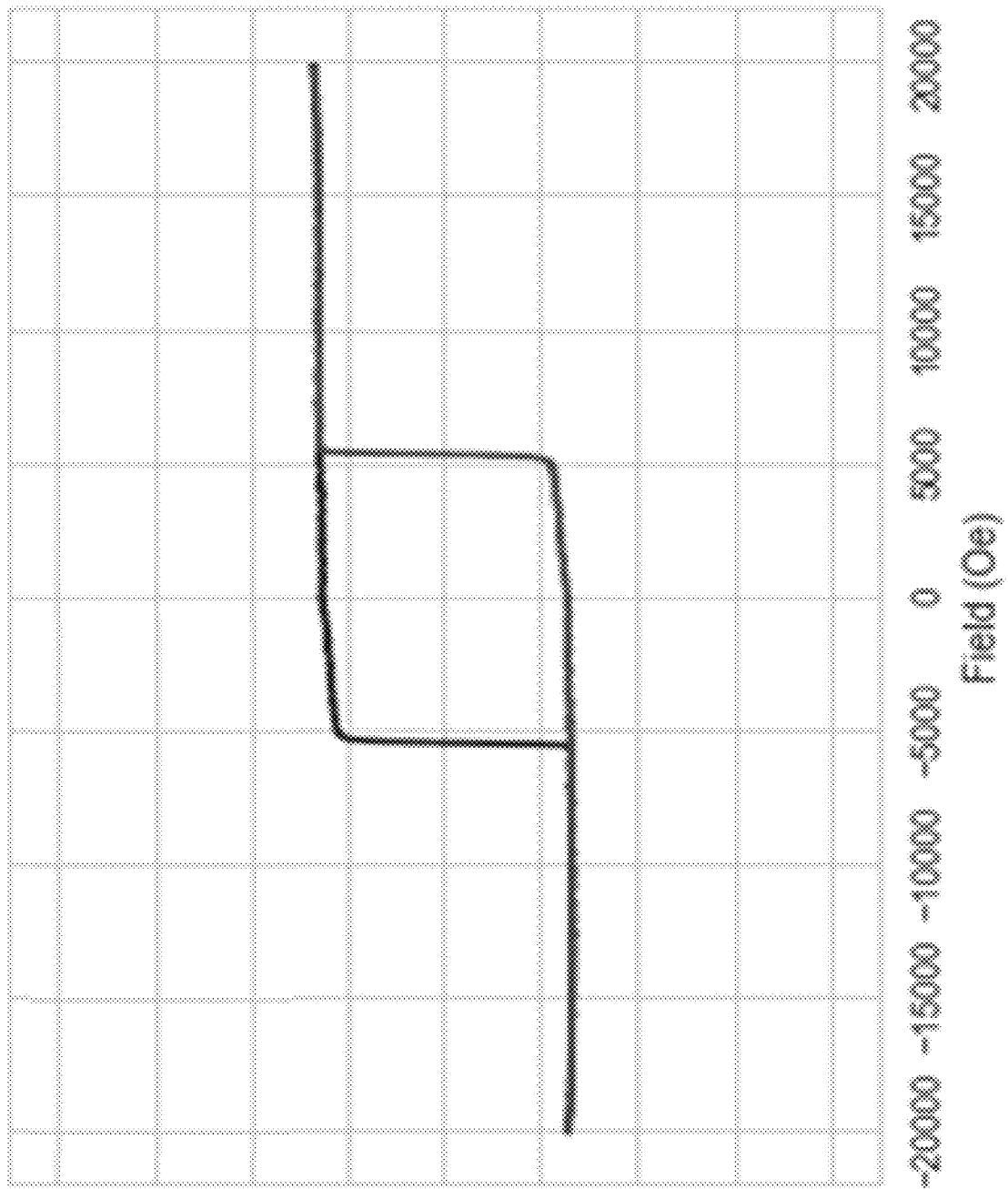
FIG. 4F illustrates magnetic moment of a reference layer as a function of an external applied field in a sample including the SAF structure of FIG. 3A after an anneal at 375 degrees Celsius.
Figure 4G:
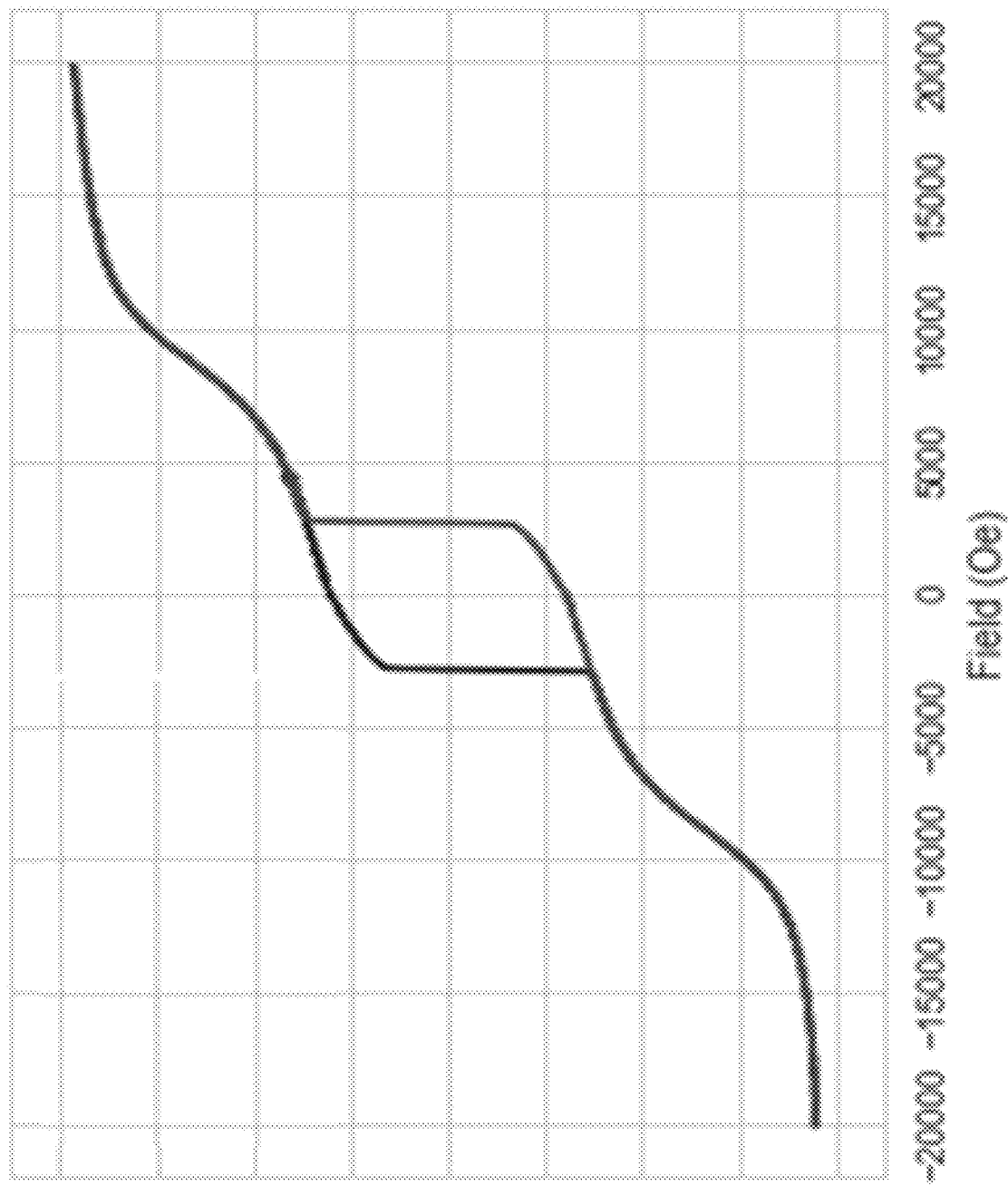
FIG. 4G illustrates magnetic moment of a reference layer as a function of an external applied field in a sample including the SAF structure of FIG. 3D after an anneal at 395 degrees Celsius.
Figure 4H:
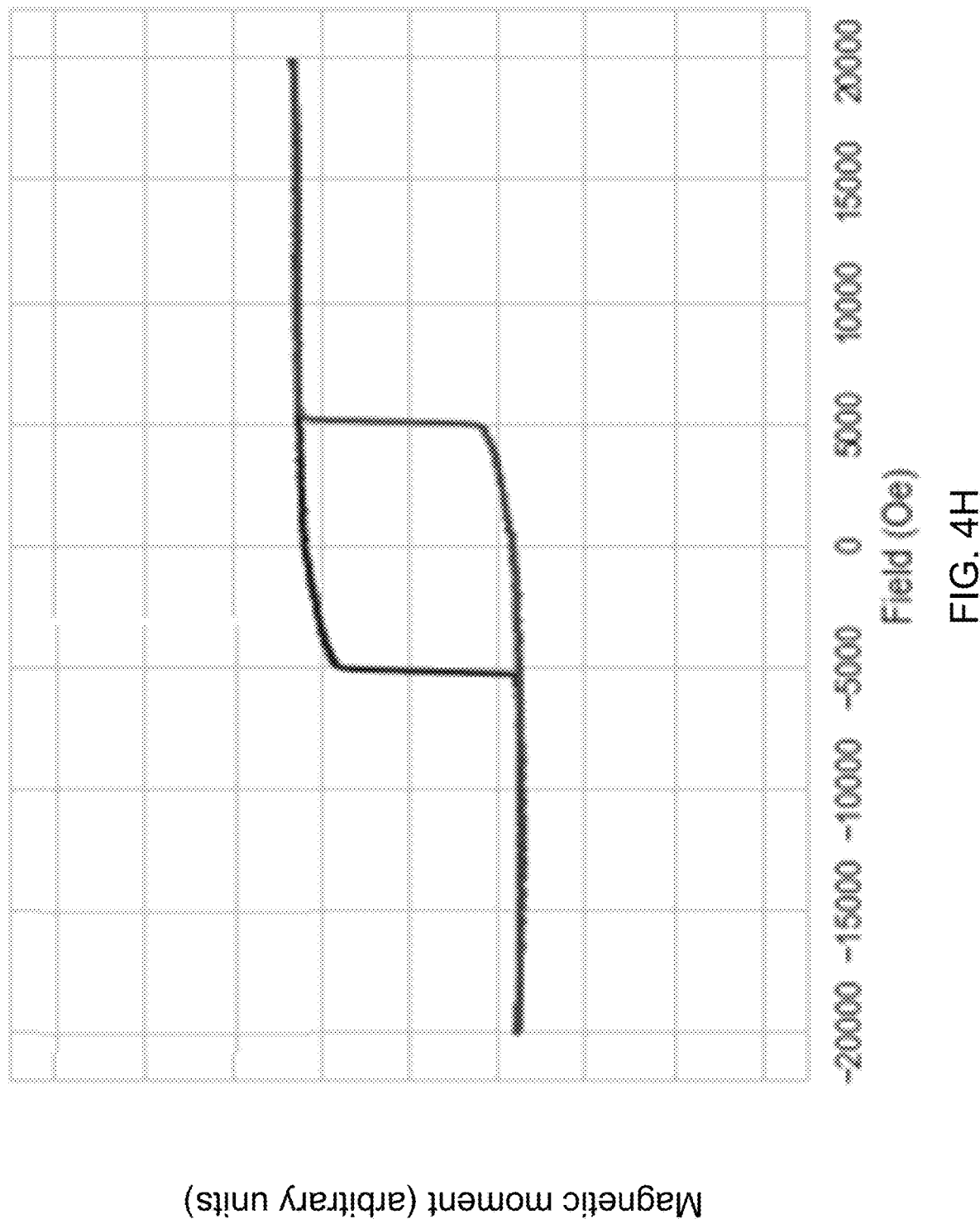
FIG. 4H illustrates magnetic moment of a reference layer as a function of an external applied field in a ample including the SAF structure of FIG. 3A after an anneal at 395 degrees Celsius.

FIG. 4C illustrates a magnetic hysteresis curve for a second sample after an anneal at 350 degrees Celsius. FIG. 4D illustrates a magnetic hysteresis curve for a first sample after an anneal at 350 degrees Celsius. FIG. 4E illustrates a magnetic hysteresis curve for a second sample after an anneal at 375 degrees Celsius. FIG. 4F illustrates a magnetic hysteresis curve for a first sample after an anneal at 375 degrees Celsius. FIG. 4G illustrates a magnetic hysteresis curve for a second sample after an anneal at 395 degrees Celsius. FIG. 4H illustrates a magnetic hysteresis curve for a first sample after an anneal at 395 degrees Celsius.

For each selected anneal temperature between 335 degrees Celsius and 395 degrees Celsius, the magnetization of the reference layer 132 in an SAF structure 200 of the first configuration of the exemplary structure of the present disclosure does not rotate up to the external magnetic field strength of up to 20 kOe for the first sample, while the magnetization of the reference layer 132 in an SAF structure 300 of a comparative exemplary structure rotates at the external magnetic field strength of 10 kOe or less. Thus, the first configuration of the SAF structure 200 illustrated in FIG. 3A provides superior stability in the magnetization in the reference layer against applied external magnetic field.

Furthermore, the comparative SAF structures 300 displays significant degradation of PMA after being annealed at temperatures of 375 degrees Celsius and above. The height of the box at the center region increases and its squareness deteriorates as the annealing temperature increases, which indicates more moment mismatch between the hard layer and the reference layer as the reference layer canting becomes more significant with high annealing temperatures. In contrast, the SAF structure 200 of the first configuration of the exemplary structure of the present disclosure shows improved robustness against high temperature annealing. The box at the center of FIGS. 4D, 4F and 4H remains consistent and its squareness is maintained up until 395 degrees Celsius.

Figure 5:
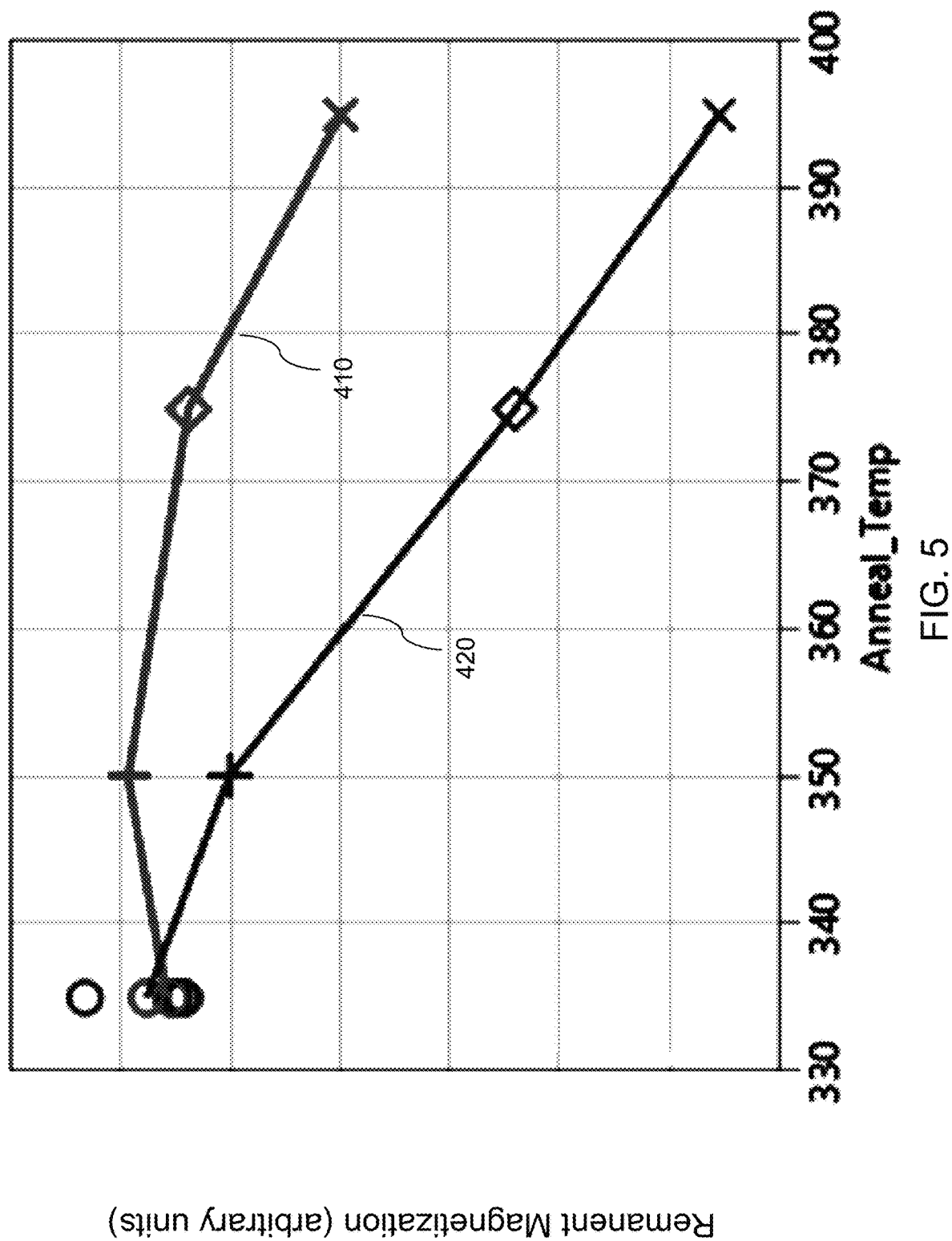
FIG. 5 is a graph illustrating the magnitude of remnant magnetization within a reference layer as a function of anneal temperature for first samples including the SAF structure of FIG. 3A and for second samples including the SAF structure of FIG. 3D.

FIG. 5 illustrates the magnitude of remanent magnetization (MR) as a function of anneal temperature for first samples including the MTJ 140 and SAF structure 200 of FIG. 3A and for second samples including the MTJ 140 and SAF structure 300 of FIG. 3D. A first curve 410 shows the remanent magnetization for the first samples including the SAF structure 200 of FIG. 3A, and a second curve shows the remanent magnetization for the second samples including the SAF structure 300 of FIG. 3D. The first samples provide a lower degradation and higher remanent magnetization than the second samples for higher temperature anneals.

Figure 6:
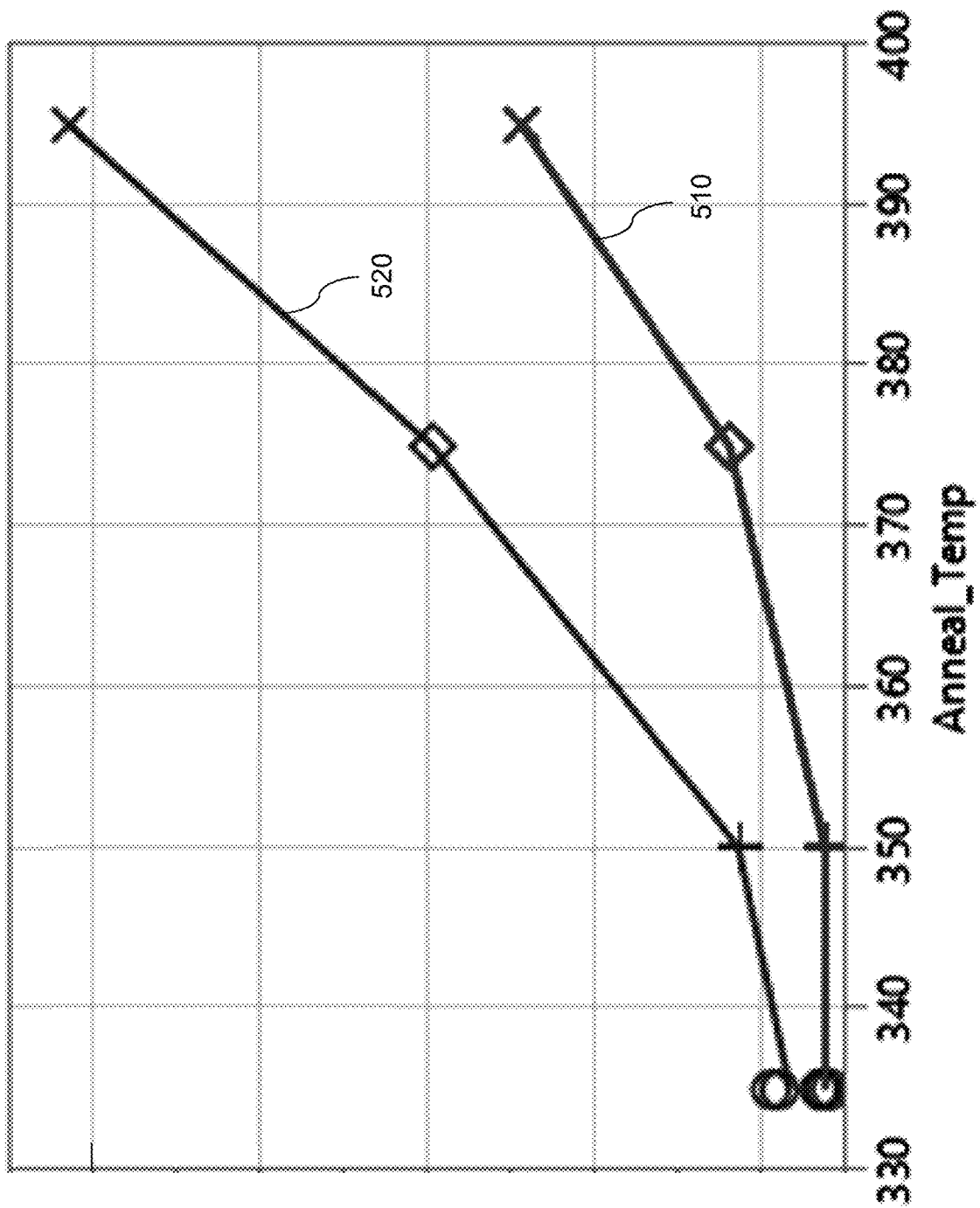
FIG. 6 is a graph illustrating the resistance-area product as a function of anneal temperature for first samples including the SAF structure of FIG. 3A and for second samples including the SAF structure of FIG. 3D.

FIG. 6 is a graph illustrating the resistance-area product (RA) in arbitrary units as a function of anneal temperature for first samples including the MTJ 140 and SAF structure 200 of FIG. 3A and for second samples including the MTJ 140 and SAF structure 300 of FIG. 3D. A first curve 510 shows the RA for the first samples including the SAF structure 200 of FIG. 3A, and a second curve 520 shows the RA for the second samples including the SAF structure 300 of FIG. 3D. The first samples provide a lower RA than the second samples at all anneal temperatures.

The SAF structure 200 of the embodiments of the present disclosure provides improved stability in the orientation of magnetization direction, a higher remanent magnetization of the reference layer, and a lower resistance-area product after relatively high anneal temperature.

Referring to all embodiments of the present disclosure, a magnetic memory device 180 contains a synthetic antiferromagnetic (SAF) structure 200 that includes an antiferromagnetically coupled stack 120 and a reference layer 132. The antiferromagnetically coupled stack 120 comprises plural multilayer stacks 12, and each multilayer stack 12 comprises at least one ferromagnetic material layer (121, 123), a non-magnetic layer 122, and a non-magnetic SAF spacer layer 130 having a different composition than the non-magnetic layer 122.

In the first embodiment illustrated in FIG. 3A, the at least one ferromagnetic material layer in each multilayer stack 12 comprises first and second ferromagnetic material layers (121, 123), the non-magnetic layer 122 in each multilayer stack 12 is located between the first and the second ferromagnetic material layers (121, 123), and the second ferromagnetic material layer 123 in each multilayer stack 12 is located between the non-magnetic layer 122 and the SAF spacer layer 130.

In the second embodiment illustrated in FIG. 3B, the at least one ferromagnetic material layer in each multilayer stack 12 consists of a single ferromagnetic material layer 121, and the non-magnetic layer 122 in each multilayer stack 12 is located between the single ferromagnetic material layer 121 and the SAF spacer layer 130.

In the third embodiment illustrated in FIG. 3C, the at least one ferromagnetic material layer in each multilayer stack 12 consists of a single ferromagnetic material layer 121 that is located between the non-magnetic layer 122 and the SAF spacer layer 130.

In one embodiment, the antiferromagnetically coupled stack 120 comprises two to twenty multilayer stacks 12, and each multilayer stack 12 other than top and bottom multilayer stacks contact two other multilayer stacks 12. In one embodiment, each of the at least one ferromagnetic material layer (121, 123), the non-magnetic layer 122, and the SAF spacer layer 130 has a thickness in a range from 1 Angstrom to 6 Angstroms.

In one embodiment, each of the at least one ferromagnetic material layer (121, 123) consists essentially of cobalt, an alloy of cobalt and iron, or an alloy of cobalt, iron, and boron, the SAF spacer layer 130 comprises iridium, ruthenium, or chromium, and the non-magnetic layer 122 comprises at platinum, palladium, rhodium, molybdenum, osmium, or vanadium. In the first embodiment illustrated in FIG. 3A, each of the multilayer stacks 12 consists of, from one side to another, a first cobalt ferromagnetic material layer 121, a platinum non-magnetic layer 122, a second cobalt ferromagnetic material layer 123, and an iridium layer SAF spacer layer 130.

In one embodiment, the magnetic memory device further comprises a ferromagnetic free layer 136 and a dielectric tunnel barrier layer 134 located between the free layer 136 and the reference layer 132. The reference layer, the dielectric tunnel barrier layer, and the free layer comprise a magnetic tunnel junction 140.

In one embodiment illustrated in FIG. 2A the magnetic memory device 180 comprises a spin-transfer torque magnetoresistive random access memory device. In another embodiment illustrated in FIG. 2B, the magnetic memory device 180 comprises a spin-orbit torque magnetoresistive random access memory device.

In one embodiment, the reference layer 132 comprises a first reference ferromagnetic layer 321, a second reference ferromagnetic layer 325, a first non-magnetic reference spacer layer 322 located between the antiferromagnetically coupled stack 120 and the first reference ferromagnetic layer 321, and a second non-magnetic reference spacer layer 324 located between the first reference ferromagnetic layer 321 and the second reference ferromagnetic layer 325.

Referring to all embodiments of the present disclosure, a method of forming a synthetic antiferromagnetic (SAF) structure 200 of a magnetic memory device 180 comprises depositing plural multilayer stacks 12 over each other to form an antiferromagnetically coupled stack 120. Each multilayer stack 12 comprises at least one ferromagnetic material layer (121, 123), a non-magnetic layer 122, and a non-magnetic SAF spacer layer 130 having a different composition than the non-magnetic layer, and depositing a reference layer 132 over the antiferromagnetically coupled stack 120.

In the first embodiment illustrated in FIG. 3A, each multilayer stack 12 is formed by depositing a first ferromagnetic material layer 121, depositing the non-magnetic layer 122 over the first ferromagnetic material layer 121, depositing a second ferromagnetic material layer 123 over the non-magnetic layer 122, and depositing the SAF spacer layer 130 over the second ferromagnetic material layer 123.

In the second embodiment illustrated in FIG. 3B, each multilayer stack 12 is formed by depositing the ferromagnetic material layer 121, depositing a non-magnetic layer 122 over the ferromagnetic material layer 121, and depositing the SAF spacer layer 130 over the non-magnetic layer 122.

In the third embodiment illustrated in FIG. 3C, each multilayer stack 12 is formed by depositing the non-magnetic layer 122, depositing the ferromagnetic material layer 121 over the non-magnetic layer 122, and depositing the SAF spacer layer 130 over the ferromagnetic material layer 121.

In one embodiment, the method also includes forming a dielectric tunnel barrier layer 134 over reference layer 132, and forming a ferromagnetic free layer 136 over the dielectric tunnel barrier layer 134, wherein the reference layer, the dielectric tunnel barrier layer, and the free layer comprise the magnetic tunnel junction 140.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetic memory device comprising a synthetic antiferromagnetic (SAF) structure that includes an antiferromagnetically coupled stack and a reference layer,
    wherein the antiferromagnetically coupled stack comprises plural multilayer stacks in which multiple instances of a unit multilayer stack are repeated such that each instance of the unit multilayer stack is in contact with at least another instance of the unit multilayer stack;
    wherein each instance of the unit multilayer stack comprises at least three layers arranged in a same order along a direction from a side that is distal from the reference layer toward a side that is proximal to the reference layer, wherein the at least three layers comprise at least one ferromagnetic material layer, a non-magnetic layer including a first non-magnetic material, and a non-magnetic SAF spacer layer including a second non-magnetic material having a different composition than the first non-magnetic material of the non-magnetic layer;
    the at least one ferromagnetic material layer in each instance of the multilayer stack comprises first and second ferromagnetic material layers;
    the non-magnetic layer in each multilayer stack is located between the first and the second ferromagnetic material layers; and
    the second ferromagnetic material layer in each multilayer stack is located between the non-magnetic layer and the SAF spacer layer.

2. The magnetic memory device of claim 1, wherein:
    the antiferromagnetically coupled stack comprises two to twenty multilayer stacks; and
    each multilayer stack other than top and bottom multilayer stacks contact two other multilayer stacks.

3. The magnetic memory device of claim 1, wherein each of the at least one ferromagnetic material layer, the non-magnetic layer, and the SAF spacer layer has a thickness in a range from 1 Angstrom to 6 Angstroms.

4. The magnetic memory device of claim 1, wherein each of the at least one ferromagnetic material layer consists essentially of cobalt, an alloy of cobalt and iron, or an alloy of cobalt, iron, and boron.

5. The magnetic memory device of claim 4, wherein the SAF spacer layer comprises iridium, ruthenium, or chromium.

6. The magnetic memory device of claim 5, wherein the non-magnetic layer comprises at least one of platinum, palladium, rhodium, molybdenum, osmium, or vanadium.

7. The magnetic memory device of claim 1, wherein each of the multilayer stacks consists of, from one side to another, a first cobalt ferromagnetic material layer, a platinum non-magnetic layer, a second cobalt ferromagnetic material layer, and an iridium layer SAF spacer layer.

8. The magnetic memory device of claim 1, further comprising:
    a ferromagnetic free layer; and
    a dielectric tunnel barrier layer located between the free layer and the reference layer, wherein the reference layer, the dielectric tunnel barrier layer, and the free layer comprise a magnetic tunnel junction.

9. The magnetic memory device of claim 8, wherein the magnetic memory device comprises a spin-transfer torque magnetoresistive random access memory device.

10. The magnetic memory device of claim 8, wherein the magnetic memory device comprises a spin-orbit torque magnetoresistive random access memory device.

11. The magnetic memory device of claim 8, wherein the reference layer comprises:
a first reference ferromagnetic layer;
a second reference ferromagnetic layer;
a first non-magnetic reference spacer layer located between the antiferromagnetically coupled stack and the first reference ferromagnetic layer; and
a second non-magnetic reference spacer layer located between the first reference ferromagnetic layer and the second reference ferromagnetic layer.

12. The magnetic memory device of claim 1, wherein:
the plural multilayer stacks comprises three or more instances of the unit multilayer stack; and
each instance of the unit multilayer stack other than a topmost instance of the unit multilayer stack and a bottommost instance of the unit multilayer stack is in contact with a respective set of two other instances of the unit multilayer stack.

13. The magnetic memory device of claim 1, wherein along the direction from the side that is distal from the reference layer toward the side that is proximal to the reference layer, the same order of the at least three layers comprises the first ferromagnetic material layer, the non-magnetic layer, the second ferromagnetic material layer, and the non-magnetic SAF spacer layer.

14. The magnetic memory device of claim 13, wherein:
the first ferromagnetic material layer comprises a first cobalt layer;
the non-magnetic layer comprises a platinum layer;
the second ferromagnetic material layer comprises a second cobalt layer; and
the non-magnetic SAF spacer layer comprises an iridium layer.

15. The magnetic memory device of claim 1, wherein the reference layer comprises:
a first non-magnetic reference spacer layer located over the non-magnetic SAF spacer layer of a last instance of the unit multilayer stack;
a first reference ferromagnetic layer located over the first non-magnetic reference spacer layer;
a second non-magnetic reference spacer layer located over the first reference ferromagnetic layer; and
a second reference ferromagnetic layer located over the second non-magnetic reference spacer layer.

16. The magnetic memory device of claim 1, wherein each instance of the SAF spacer layer provides antiferromagnetic coupling between a pair of instances of ferromagnetic material layers located within two different instances of the unit multilayer stack.

17. A magnetic memory device comprising a synthetic antiferromagnetic (SAF) structure that includes an antiferromagnetically coupled stack and a reference layer,
wherein the antiferromagnetically coupled stack comprises plural multilayer stacks in which multiple instances of a unit multilayer stack are repeated such that each instance of the unit multilayer stack is in contact with at least another instance of the unit multilayer stack;
wherein each instance of the unit multilayer stack comprises at least three layers arranged in a same order along a direction from a side that is distal from the reference layer toward a side that is proximal to the reference layer, wherein the at least three layers comprise at least one ferromagnetic material layer, a non-magnetic layer including a first non-magnetic material, and a non-magnetic SAF spacer layer including a second non-magnetic material having a different composition than the first non-magnetic material of the non-magnetic layer;
wherein the plural multilayer stacks comprises three or more instances of the unit multilayer stack; and
wherein each instance of the unit multilayer stack other than a topmost instance of the unit multilayer stack and a bottommost instance of the unit multilayer stack is in contact with a respective set of two other instances of the unit multilayer stack.

* * * * *